US006630832B1

(12) United States Patent
Harzanu et al.

(10) Patent No.: US 6,630,832 B1
(45) Date of Patent: Oct. 7, 2003

(54) METHOD AND APPARATUS FOR THE ELECTRICAL TESTING OF PRINTED CIRCUIT BOARDS EMPLOYING INTERMEDIATE LAYER GROUNDING

(75) Inventors: Benyamin Harzanu, Nes Ziona (IL); Raviv Weber, Ashkelon (IL); Hanan Golan, Or Yehuda (IL)

(73) Assignee: Orbotech Limited (IL)

( * ) Notice: Subject to any disclaimer, the term of this patent is extended or adjusted under 35 U.S.C. 154(b) by 0 days.

(21) Appl. No.: 09/719,753
(22) PCT Filed: Jun. 16, 1999
(86) PCT No.: PCT/IL99/00333
§ 371 (c)(1), (2), (4) Date: Feb. 27, 2001
(87) PCT Pub. No.: WO99/65287
PCT Pub. Date: Dec. 23, 1999

(30) Foreign Application Priority Data

Jun. 16, 1998 (IL) .................................................. 124961

(51) Int. Cl.$^7$ ........................ H01H 31/02; H01H 31/04; G01R 31/302
(52) U.S. Cl. ........................ 324/537; 324/538; 324/750
(58) Field of Search ........................ 324/537, 95, 501, 324/750, 158.1, 538

(56) References Cited

U.S. PATENT DOCUMENTS

| 4,647,849 | A | 3/1987 | Strickland et al. ............. 324/95 |
| 5,006,788 | A | 4/1991 | Goulette et al. ............... 324/95 |
| 5,122,753 | A | 6/1992 | Myers et al. ................. 324/537 |
| 5,202,640 | A | 4/1993 | Schaaf et al. ................ 324/537 |
| 5,218,294 | A | 6/1993 | Soiferman ................. 324/158 R |
| 5,254,953 | A | 10/1993 | Crook et al. ................. 324/538 |
| 5,406,209 | A | 4/1995 | Johnson et al. .............. 324/750 |
| 5,424,633 | A | 6/1995 | Soiferman ................. 324/158.1 |
| 5,426,372 | A | 6/1995 | Freve ........................ 324/538 |
| 5,428,626 | A | 6/1995 | Frisch et al. .................. 371/27 |
| 5,469,051 | A | 11/1995 | Yarmchuk ................. 324/158.1 |
| 5,517,110 | A | 5/1996 | Soiferman ................. 324/158.1 |
| 5,646,522 | A | 7/1997 | Etemadpour et al. .... 324/158.1 |
| 5,821,759 | A | 10/1998 | Scaman et al. .............. 324/529 |
| 5,942,911 | A | 8/1999 | Motika et al. ............... 324/769 |
| 6,087,842 | A | 7/2000 | Parker et al. ................ 324/763 |
| 6,097,202 | A | 8/2000 | Takahashi .................... 324/761 |
| 6,154,038 | A | 11/2000 | Ito et al. ..................... 324/750 |
| 6,160,517 | A | 12/2000 | Bell et al. .................... 343/703 |
| 6,201,398 | B1 | 3/2001 | Takada ........................ 324/537 |
| 6,242,923 | B1 | 6/2001 | Scaman et al. .............. 324/529 |
| 6,268,719 | B1 | 7/2001 | Swart ........................ 324/58.1 |
| 6,268,738 | B1 | 7/2001 | Gunthorpe et al. ......... 324/750 |

FOREIGN PATENT DOCUMENTS

| DE | 44 17 580 C2 | 3/1995 | |
| EP | 0 498 007 A1 | 8/1992 | |
| GB | 2143954 A | 2/1985 | |
| GB | 2143959 A | 2/1985 | ........... G01G/11/00 |
| GB | 2312519 A | 10/1997 | |

Primary Examiner—N. Le
Assistant Examiner—Timothy J. Dole
(74) Attorney, Agent, or Firm—Bromberg & Sunstein LLP

(57) ABSTRACT

This invention discloses an apparatus for electrical testing of an electrical circuit (12) having first and second side surfaces and including a plurality of conductors, the apparatus including at least one stimulation electrode (14, 16, 20) disposed adjacent at least one of the first and second side surfaces of the electrical circuit and being operative to apply thereto a stimulation electromagnetic field in a non-contact manner, at least one sensing electrode (25) disposed adjacent at least one of the first and second side surfaces of the electrical circuit and being operative to sense a resulting electromagnetic field produced by application of the stimulation electromagnetic field at various locations thereon in a non-contact manner wherein at least one of the at least one stimulation electrode and the at least one sensing electrode includes at least two electrodes at least one of which is disposed adjacent each of the first and second side surfaces of the electrical circuit. A method for electrical testing of an electrical circuit having first and second side surfaces and including a plurality of conductors is also disclosed.

41 Claims, 16 Drawing Sheets

METHOD AND APPARATUS FOR THE ELECTRICAL TESTING OF PRINTED CIRCUIT BOARDS EMPLOYING INTERMEDIATE LAYER GROUNDING

FIELD OF THE INVENTION

The present invention relates to equipment and methods for testing the electrical integrity of electrical circuits, and more particularly to equipment and methods for the non-contact electrical testing of printed circuit boards ("PCBs"), chip carriers and similar electrical circuits having conductors of various configurations.

BACKGROUND OF THE INVENTION

Electrical circuits, such as PCBs and chip carriers, are generally tested after manufacture to determine whether or not all of the conductors and other electrically conductive elements in the circuit are in their designated positions and to ensure that they are not unintentionally cut, shorted or otherwise have an undesired continuity or lack thereof. The conductors of electrical circuits are normally interconnected to define nets.

Conventional methods and apparatus for electrically testing electrical circuits typically employ some kind of physical contact with the nets. For example, in moving probe apparatus, a pair of probes may be physically moved by an X-Y mechanism into and out of contact with terminals of various nets. Because nets are tested sequentially by moving the probes from net to net, moving probe testing is a relatively slow method for electrically testing complicated electrical circuits.

Another method for electrically testing electrical circuits employs a so-called "bed-of-nails" testing fixture. A bed-of-nails fixture typically includes a large number of pins, which are positioned so that when a circuit to be tested is pressed thereagainst, the pins come into electrical contact with pads at the terminal ends of each net to establish electrical contact therewith. The conductivity of each net is subsequently measured. Although an electrical circuit can be tested much faster on an existing bed-of-nails fixture than by using a moving probe, bed-of-nails testing requires a dedicated fixture to be constructed for each electrical circuit configuration. As a result, bed-of-nails testing is, overall, a time consuming and costly solution.

Electrical testing methods which rely on physical contact with an electrical circuit to be tested, such as the moving probe and bed-of-nails methods described above, suffer from at least two additional fundamental disadvantages: First, as the size of pads at the terminal ends of conductors on electrical circuits decreases and their density increases, it becomes increasingly difficult to obtain adequate electrical contact therewith. Second, physical contact between conductor pads and the probes or pins may damage the pads.

To overcome these difficulties, a number of non-contact electrical testing methods have been proposed. One non-contact printed circuit board testing method is described in U.S. Pat. No. 5,218,294, issued to Soiferman. The patent describes stimulating a PCB under test with an AC signal through power and ground lines or layers, or in a non-contact manner by employing a near-field active antenna. The resulting stimulation generates an electromagnetic field which characterizes the PCB under test. The electromagnetic field proximate to the PCB under test is measured in a non-contact manner and compared to the electromagnetic field of a known faultless circuit board to determine whether the PCB under test is defective.

U.S. Pat. No. 5,517,110, also issued to Soiferman, describes non-contact stimulation of a PCB by a pair of stimulators located adjacent to the PCB on one side thereof. A resulting electromagnetic field is detected using a sensor array located between the stimulators on the same side of the PCB.

U.S. Pat. No. 5,424,633, issued to Soiferman describes a spiral loop antenna useful in the electrical testing of PCBs, as well as electrical testing in which an electromagnetic field is applied to a first side of a PCB under test by a non contact stimulator and an array of non-contact sensors on an opposite side of the PCB is operative to measure an electromagnetic field that is characteristic of the PCB when stimulation is applied. This system is able to electrically test nets that have terminal points on opposite sides of a PCB and relatively thin PCBs that do not have internal metal layers.

SUMMARY OF THE INVENTION

The present invention seeks to provide improved methods and apparatus for non-contact electrical testing of electrical circuits such as PCBs. For the purpose of the description and claims which follow, an electrical circuit being tested is referred to as a "board under test" or "BUT".

One aspect of a preferred embodiment of the present invention provides for the non-contact electrical testing of BUTs, such as PCBs, that have nets which begin and terminate on the same side thereof, and that have other nets which begin and terminate on opposite sides thereof.

Another aspect of a preferred embodiment of the present invention provides for the non-contact electrical testing of BUTs, such as PCBs, that have internal metal layers and conductors that cross through or between the metal layers.

In accordance with a preferred embodiment of the invention, non-contact electrical testing of BUTs, such as PCBs, that have nets which begin and terminate on the same side as well as nets which begin and terminate on opposite sides is performed generally simultaneously. One side of a BUT is stimulated with an AC electric field at a first frequency and the other side of the BUT is stimulated with an AC electric field at a second frequency. Potentials induced by the different frequency stimulation in conductors on the BUT are measured and separated according to frequency.

It is readily appreciated that by applying stimulation to both sides of the BUT that results in separable potentials that are identified with stimulation applied to one side or the other of BUT, the electric continuity in different types of conductors on a BUT can be tested simultaneously.

In accordance with a still further aspect of the present invention, a pattern of potentials on a BUT is analyzed and compared to a pattern characteristic of an electrical circuit known to be not defective.

There is thus provided in accordance with a preferred embodiment of the present invention an apparatus for electrical testing of an electrical circuit having first and second side surfaces and including a plurality of conductors, the apparatus including at least one stimulation electrode disposed adjacent at least one of the first and second side surfaces of the electrical circuit and being operative to apply thereto a stimulation electromagnetic field in a non-contact manner, at least one sensing electrode disposed adjacent at least one of the first and second side surfaces of the electrical circuit and being operative to sense a resulting electromagnetic field produced by application of the stimulation electromagnetic field at various locations thereon in a non-contact manner, wherein at least one of the at least one stimulation electrode and the at least one sensing electrode includes at least two electrodes at least one of which is disposed adjacent each of the first and second side surfaces of the electrical circuit.

Further in accordance with a preferred embodiment of the present invention the at least one stimulation electrode includes at least first and second stimulation electrodes disposed adjacent respective ones of the first and second side surfaces of the electrical circuit.

Still further in accordance with a preferred embodiment of the present invention the at least one sensing electrode includes at least first and second sensing electrodes disposed adjacent respective ones of the first and second side surfaces of the electrical circuit.

Further in accordance with a preferred embodiment of the present invention there is provided at least one stimulation signal generator providing at least one stimulation signal to the at least one stimulation electrode.

Additionally in accordance with a preferred embodiment of the present invention the at least one stimulation signal generator provides stimulation signals to a plurality of stimulation electrodes in a manner such that signals induced in the electrical circuit by individual ones of the stimulation electrodes may be distinguished from each other, and preferably also includes at least one separating detector for receiving from the at least one sensing electrode signals induced in the electrical circuit by individual ones of the stimulation electrodes and distinguishes the signals from each other.

Additionally the apparatus for electrical testing of an electrical circuit also includes a signal analyzer operative to analyze at least one signal received from the at least one sensing electrode and a comparator receiving at least one signal derived from the resulting electromagnetic field and operative to compare the at least one signal with a reference.

Preferably the apparatus for electrical testing of an electrical circuit also includes a defect report generator providing a defect report relating to the electrical circuit based on the output of the comparator.

Additionally in accordance with a preferred embodiment of the present invention the at least one stimulation electrode includes first and second stimulation electrodes arranged to be disposed alongside a first side of the electrical circuit and a third stimulation electrode arranged to be disposed alongside a second side of the electrical circuit. Preferably the at least one sensing electrode includes a linear array of sensing electrodes.

Still further in accordance with a preferred embodiment of the present invention the linear array is disposed intermediate the first and second stimulation electrodes.

Additionally or alternatively the at least one stimulation electrode includes a linear array of stimulation electrodes.

Preferably the at least one sensing electrode includes first and second sensing electrodes arranged to be disposed alongside a first side of the electrical circuit and a third sensing electrode arranged to be disposed alongside a second side of the electrical circuit.

Further in accordance with a preferred embodiment of the present invention the at least one sensing electrode includes first and second sensing electrodes arranged to be disposed alongside a first side of the electrical circuit.

Still further in accordance with a preferred embodiment of the present invention the linear array is disposed intermediate the first and second stimulation electrodes.

Moreover in accordance with a preferred embodiment of the present invention the at least one signal generator provides signals having different frequencies to different ones of the stimulation electrodes, and the at least one signal generator provides multiplexed signals to different ones of the stimulation electrodes.

Preferably the at least one stimulation electrode includes a plurality of individually controllable sections.

There is also provided in accordance with a preferred embodiment of the present invention a method for electrical testing of an electrical circuit having first and second side surfaces and including a plurality of conductors, the method including the steps of applying an electromagnetic field in a non-contact manner to at least one of first and second side surfaces of the electrical circuit and sensing a resulting electromagnetic field in a non-contact manner at various locations along at least one of the first and second side surfaces of the electrical circuit, wherein at least one of the applying and sensing steps employs non-contact electrodes disposed along both the first and second side surfaces of the electrical circuit.

Further in accordance with a preferred embodiment of the present invention the applying step includes employing at least first and second stimulation electrodes disposed adjacent respective ones of the first and second side surfaces of the electrical circuit to apply at least one electromagnetic field thereto.

Preferably the sensing step includes employing at least first and second sensing electrodes disposed adjacent respective ones of the first and second side surfaces of the electrical circuit to sense the resulting electromagnetic field.

Still further in accordance with a preferred embodiment of the present invention at least one stimulation signal and is generated and provided to at least one stimulation electrode.

Additionally in accordance with a preferred embodiment of the present invention the generating step includes providing stimulation signals to a plurality of stimulation electrodes in a manner such that signals induced in the electrical circuit by individual ones of the stimulation electrodes may be distinguished from each other. Additionally or alternatively the method also includes receiving signals induced in the electrical circuit by individual stimulation electrodes and distinguishing the signals from each other.

Preferably the method electrical testing of an electrical circuit also includes analyzing at least one signal induced in the electrical circuit.

Moreover according to a preferred embodiment, the present invention also includes receiving at least one signal derived from the resulting electromagnetic field and comparing the at least one signal with a reference. Preferably the step also includes providing a defect report relating to the electrical circuit based on the comparing step.

Additionally according to a preferred embodiment of the present invention the applying step employs first and second stimulation electrodes disposed alongside a first side of the electrical circuit and a third stimulation electrode disposed alongside a second side of the electrical circuit.

Still further according to a preferred embodiment of the present invention the sensing step employs a linear array of sensing electrodes. The linear array may also be disposed intermediate first and second stimulation electrodes.

Additionally according to a preferred embodiment of the present invention the applying step employs a linear array of stimulation electrodes. Furthermore the linear array is disposed intermediate first and second stimulation electrodes.

Preferably the sensing step employs first and second sensing electrodes disposed alongside a first side of the electrical circuit and a third sensing electrode disposed alongside a second side of the electrical circuit. Additionally or alternatively the sensing step employs first and second sensing electrodes disposed alongside a first side of the electrical circuit.

Preferably the method for electrical testing of an electrical circuit includes a generating step in which signals having different frequencies are provided to different ones of the stimulation electrodes. Additionally or alternatively the generating step includes providing multiplexed signals to different ones of the stimulation electrodes.

Still further in accordance with a preferred embodiment of the present invention the applying step employs at least one stimulation electrode including a plurality of individually controllable sections.

Additionally according to a preferred embodiment of the present invention also includes the step of grounding an intermediate metal layer in the electrical circuit.

Moreover in accordance with a preferred embodiment of the present invention the sensing step includes sensing potentials on one side of the electrical circuit and sensing potentials on the opposite side of the electrical circuit.

There is also provided in accordance with yet another preferred embodiment of the present invention a method for electrical testing of a multi-layered electrical circuit having first and second side surfaces and including a plurality of conductors, the method including the steps of grounding an intermediate metal layer in the electrical circuit, inducing potentials into at least some of the conductors of the electrical circuit, and sensing a resulting electromagnetic field in a non-contact manner at various locations along at least the first side surface thereof to obtain electromagnetic field data characteristic of the electrical circuit.

Further in accordance with a preferred embodiment of the present invention also includes sensing a resulting electromagnetic field at various locations along at least the second side surface thereof to obtain electromagnetic field data characteristic of the electrical circuit.

Still further in accordance with a preferred embodiment of the present invention the electromagnetic field data is for the potential in conductors including the electrical circuit. Furthermore, the inducing step may include inducing potentials on both a first side and a second side of the electrical circuit.

Additionally in accordance with a preferred embodiment of the present invention the inducing step includes inducing potentials on the first side of the electrical circuit which are differentiable from potentials induced on the second side of the circuit.

Moreover in accordance with a preferred embodiment of the present invention the inducing step includes inducing potentials which are differentiable by frequency.

Still further in accordance with a preferred embodiment, the present invention provides a method for electrical testing of a multi-layered electrical circuit wherein the inducing step includes inducing potentials which are multiplexed.

Moreover in accordance with a preferred embodiment of the present invention the sensing step includes sensing electromagnetic field data on one side of the electrical circuit. Preferably the sensing step further includes distinguishing the electromagnetic field resulting from potentials induced on the first side of the electrical circuit from the electromagnetic field resulting from potentials induced on the second side of the electrical circuit.

Further in accordance with a preferred embodiment of the present invention the inducing step includes inducing potentials on a first side of the electrical circuit.

Additionally or alternatively the inducing step employs a plurality of stimulators, and each stimulator induces potentials which are differentiable by frequency. Preferably the inducing step employs a plurality of stimulators, and each stimulator induces potentials which are multiplexed.

Additionally in accordance with a preferred embodiment of the present invention the sensing step employs at least a first sensor and a second sensor arranged along a first side of the electrical circuit. Preferably the sensing step additionally employs a third sensor located along a second side of the electrical circuit.

Moreover in accordance with a preferred embodiment of the present invention also includes correlating electromagnetic field data sensed by the sensors to a stimulator. Additionally or alternatively a preferred embodiment of the present invention also includes determining electrical continuity of at least some of the conductors by comparing the electromagnetic field data to reference electromagnetic field data characteristic of a desired electrical circuit.

Still further in accordance with a preferred embodiment of the present invention the inducing step is carried out in a non-contact manner.

There is further provided in accordance with a preferred embodiment of the present invention a method for electrical testing of a multi-layered electrical circuit having first and second side surfaces and including a plurality of conductors, the method including the steps of stimulating the electric circuit to induce in proximity thereto an electromagnetic field, acquiring electromagnetic field data in a non-contact manner at various locations along the first side surface, acquiring electromagnetic field data in a non-contact manner at various locations along the second side surface, and determining electrical continuity characteristics of the conductors by analysis of electromagnetic field data for the first side surface and by analysis of electromagnetic field data for the second side surface.

Preferably in the method for electrical testing of a preferred embodiment of the present invention, the analysis steps employs reference data which is characteristic of an electrical circuit having known structure.

Still further in accordance with a preferred embodiment of the present invention the electrical circuit is a multi-layered circuit which includes at least one intermediate layer which is substantially completely metalized, and the method includes grounding the at least one substantially completely metalized layer.

There is further provided in accordance with a preferred embodiment of the present invention a method for electrical testing of an electrical circuit having a plurality of electrically conductive elements, the method including the steps of applying a first electromagnetic field to the electrical circuit with at least one stimulator located near but not contacting the article on a first side thereof, applying a second electromagnetic field to the article at generally the same time as the first electromagnetic field with at least one stimulator located near but not contacting the article on a second side thereof, and separately detecting first and second potentials induced on the electrically conductive elements of the article by the first and second electromagnetic fields, respectively.

Further in accordance with a preferred embodiment of the present invention the first and second steps of applying an electromagnetic field include the steps of generating electromagnetic signals of first and second frequencies, respectively.

Still further in accordance with a preferred embodiment of the present invention the step of separately detecting includes the step of sensing the potentials with at least one sensor located near the first side of the article. Preferably the method further includes the step of scanning by at least one sensor.

Additionally according to a preferred embodiment of the present invention the step of scanning includes the step of scanning in a first scanning direction and followed by the step of scanning in a second scanning direction which is substantially perpendicular to the first scanning direction. Additionally or alternatively the step of scanning includes the step of scanning the article in a first position followed by the step of scanning the article in a second position which is upside-down from the first position.

Preferably the method further including step of grounding internal metal layers of the article.

There is also provided in accordance with a preferred embodiment of the present invention an apparatus for electrically testing an article having an electric circuit therein formed of a plurality of conductors, in which the apparatus includes (i) a first electromagnetic field generator applying a first electromagnetic field to the article, wherein the first field generator includes at least one stimulator located near but not in contact with a first side of the article, and (ii) a second electromagnetic field generator applying a second electromagnetic field to the article, wherein the second field generator includes at least one stimulator located near but not in contact with a second side of the article, wherein the second side is opposite the first side, and (iii) a sensor operative to separately detect first and second potentials induced on the conductors by the first and second electromagnetic fields, respectively.

Further in accordance with a preferred embodiment of the present invention the sensor includes an array of sensors adjacent to the at least one stimulator of the first field generator. Preferably the first field generator generates an electromagnetic field at a first frequency, and the second field generator generates an electromagnetic field at a second frequency. Additionally or alternatively in the apparatus for electrically testing an article, the first field generator includes a first stimulator and a second stimulator operative to generate the electromagnetic field.

Additionally according to a preferred embodiment of the present invention the first stimulator and second stimulator each generate a field which are 180 degrees out of phase with respect to each other. Preferably the stimulators are made of a plurality of strip-shaped elements.

Still further in accordance with a preferred embodiment of the present invention the strip-shaped elements extend obliquely relative to the array of sensors.

Additionally or alternatively at least one of the stimulators is made of a plurality of patch-shaped stimulators.

There is also provided in accordance with a preferred embodiment of the present invention a method for electrically testing an article having a plurality of conductors therein, which preferably includes the steps of subjecting a first side of the article to an electromagnetic field with at least one stimulator in close but not in contact arrangement with a first side of the article, scanning the side of the article in at least two partially orthogonal directions with a not in contact sensor, sensing potentials induced on the conductors by the electromagnetic field, and analyzing the potentials to determine the existence of defects in the elements.

Still further in accordance with a preferred embodiment of the present invention the method also includes the additional steps of subjecting a second side of the article to a second electromagnetic field with a second stimulator in close but not in contact arrangement with the second side, scanning the side of the article in at least two at least partially orthogonal directions with a not in contact sensor and sensing the induction of potentials induced on the elements by the second electromagnetic field, and analyzing the potentials induced by the second electromagnetic field to determine the existence of defects in the elements.

Additionally according to a preferred embodiment of the present invention the article is subjected to the first and second electromagnetic fields at generally the same time. Preferably the electromagnetic fields are propagated at different frequencies. Additionally or alternatively the article includes a metal layer, and the metal layer is grounded.

Moreover according to a preferred embodiment of the present invention the article is subjected to the first and second electromagnetic fields one after the other.

There is also provided in accordance with a preferred embodiment of the present invention a method for the electrical testing of an article having a plurality of electrically conductive elements and internal conductive layers, the method including the steps of subjecting the article to an electromagnetic field with at least one stimulator in close but not in contact arrangement with at least one side of the article, grounding the internal conductive layers of the article, scanning the at least one side of the article with a not in contact sensor and sensing the induction of potentials induced on the elements by the electromagnetic field, and analyzing the potentials to determine the existence of defects in the elements.

BRIEF DESCRIPTION OF THE DRAWINGS

These and other features and advantages of the present invention will become apparent from the ensuing detailed description of the preferred embodiments, given by way of example only, when taken in conjunction with the drawings, in which.

DETAILED DESCRIPTION OF THE PRESENT INVENTION

Figure 1:
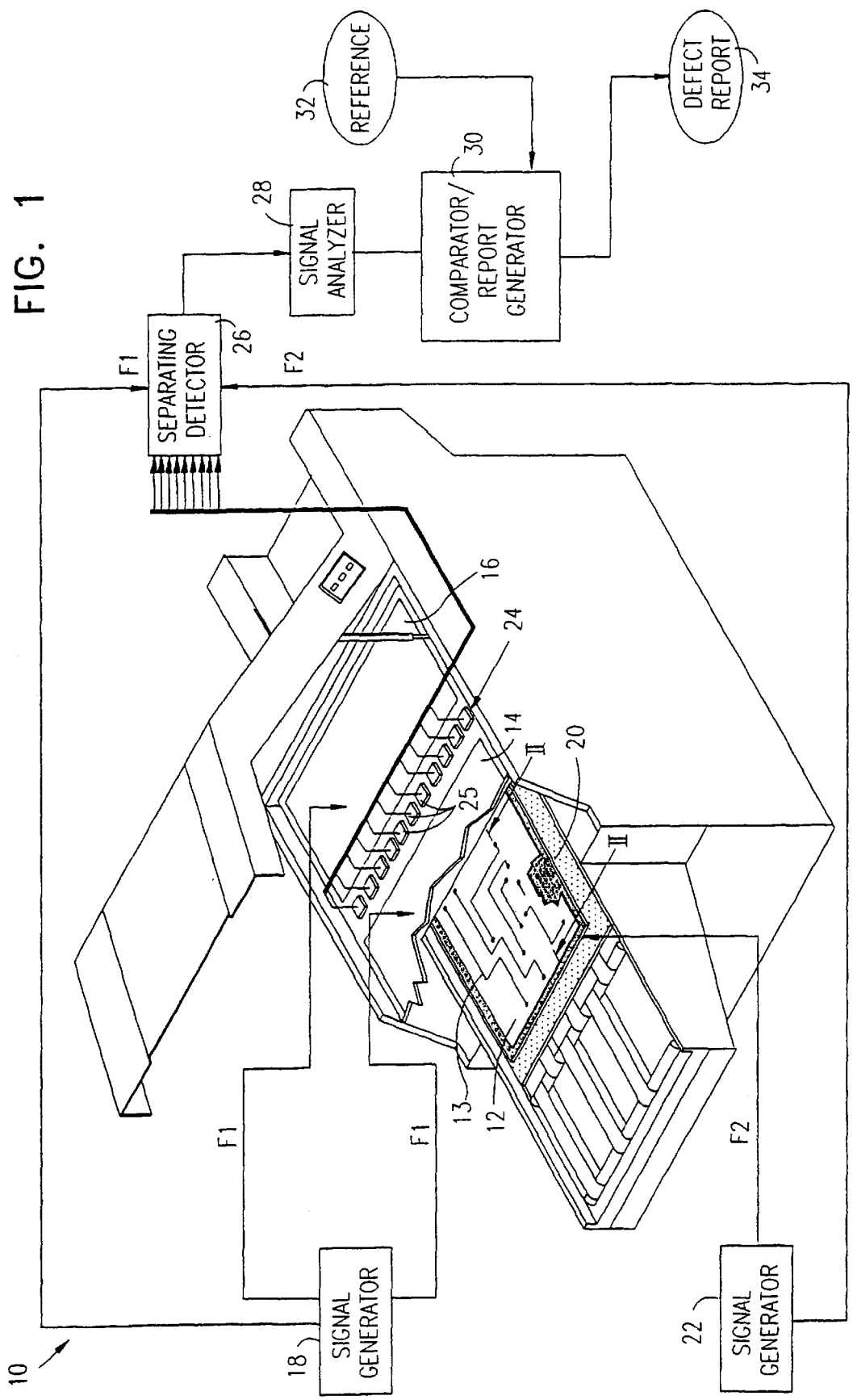
FIG. 1 is a simplified pictorial illustration of non-contact electrical testing apparatus, constructed and operative in accordance with a first preferred embodiment of the present invention.

Reference is now made to FIG. 1 which is a schematic illustration of non-contact electrical testing apparatus, constructed and operative in accordance with a preferred embodiment of the present invention. Testing apparatus 10 is operative to perform non-contact electrical testing of electrical circuits, such as are found on a BUT 12, having a multiplicity of electrical conductors 13. Although the present invention is generally described in the context of non-contact electrical testing of printed circuit boards, it is readily appreciated that the methods and apparatus disclosed herein are generally applicable to the non-contact electrical testing of other electrical circuits including, for example, chip carriers, ball grid array substrates, multi-chip modules, hybrid circuit substrates and printed circuit boards loaded with electronic components. Reference herein to BUTs shall be deemed to additionally refer to other suitable similar forms of electrical circuits.

In a preferred embodiment of the invention, testing apparatus 10 includes two first side stimulators 14 and 16 disposed to be adjacent to a first side of a BUT 12 and a first signal generator 18 supplying first AC electrical stimulation signals to stimulator electrodes 14 and 16, hereinafter referred to as stimulators. A second side stimulator electrode 20, hereinafter referred to as stimulator 20, is disposed to be adjacent to an opposite side of the BUT 12 and a second signal generator 22 provides second AC electrical stimulation signals thereto. An array of sensor electrodes 24, preferably comprising a plurality of individual sensors 25 arranged along a line, is preferably disposed between stimulators 14 and 16. Preferably, first side stimulators 14 and 16 and sensors 25 are configured in as described in U.S. Pat. No. 5,517,110, incorporated herein by reference.

A separating detector 26 receives the outputs of each sensor 25 and supplies them to a signal analyzer 28 which outputs to a comparator and report generator 30. As used herein, the terms "first side stimulators" 14 and 16 and "second side stimulator" 20 relate to their respective locations as shown in FIG. 1. It is readily appreciated by those skilled in the art that the important factor relating to the position of the stimulators is that the two sets of stimulators are on geometrically opposing sides of BUT 12. It is not of consequence which stimulators are above or below BUT 12.

Preferably, the AC signals provided by first generator 18 and second generator 22 respectively are different. For example, the AC signals provided by first generator 18 to first side stimulators 14 and 16 are at a first frequency F1 while the AC signals provided by second generator 22 for second side stimulator 20 are at a second frequency F2. Preferably, first signal generator 18 provides signals to respective first side stimulators 14 and 16 which are equal in amplitude and 180° out of phase with respect to each other.

It is readily appreciated that instead of distinguishing the AC signals by frequency, the signals provided by first generator 18 and second generator 22 may be at the same frequency but distinguished from each other by suitable known signal separation techniques.

When energized by the AC electrical stimulation signals, first and second first side stimulators 14 and 16 and second side stimulator 20 generate electromagnetic fields which stimulate BUT 12 and induce measurable potentials on conductors 13 of BUT 12. Each sensor 25 in array 24 senses the potential induced in the conductors. Preferably, the potentials are sensed by sensors 25 by capacitive coupling. Alternatively any other suitable sensing technique may be employed.

Preferably, the AC electrical stimulation signals have a frequency in the range of 10 KHz to 20 MHz, and more preferably about 1 MHz. First side stimulators 14 and 16 are preferably each as large as BUT 12 and separated therefrom by an air gap typically 0.2 mm–2 mm, preferably as thin as possible due to mechanical limitations, or other suitable insulating layer.

In a preferred embodiment of the present invention, BUT 12 and second side stimulator 20, which is preferably sufficiently large to underlie all of BUT 12, are moved linearly past sensor array 24 and stimulators 14 and 16. It is readily appreciated that alternatively BUT 12 and stimulator 20 may be held stationary while sensor array 24 and stimulators 14 and 16 are moved. Other combinations may also be suitable to scan BUT 12 with sensor array 24.

As is readily appreciated, the potentials induced in conductors 13 are distinguishable from each other to the extent that the stimuli which induce these potentials are distinguishable from each other, for example by frequency or by multiplexing.

By employing information indicating potentials at various locations on BUT 12 sensed by sensors 25, signal analyzer 28 generates a precise representation characteristic of potentials in conductors 13 on a BUT 12, which indicates, inter alia, conductor continuity and which includes information regarding shorts and breaks in conductors constituting defects.

The representation provided by signal analyzer 28 to comparator and report generator 30 enables provision of a defect report 34 indicating defective electrical continuity in conductors 13 of BUT 12 (FIG. 1), such as missing continuity where continuity is expected (opens and cuts in conductors) and excess continuity where not expected (shorts between conductors). The defect report preferably is generated by comparing the representation supplied by signal analyzer 28 with a reference 32 representing a non-defective printed circuit board having the same design.

Figure 2:
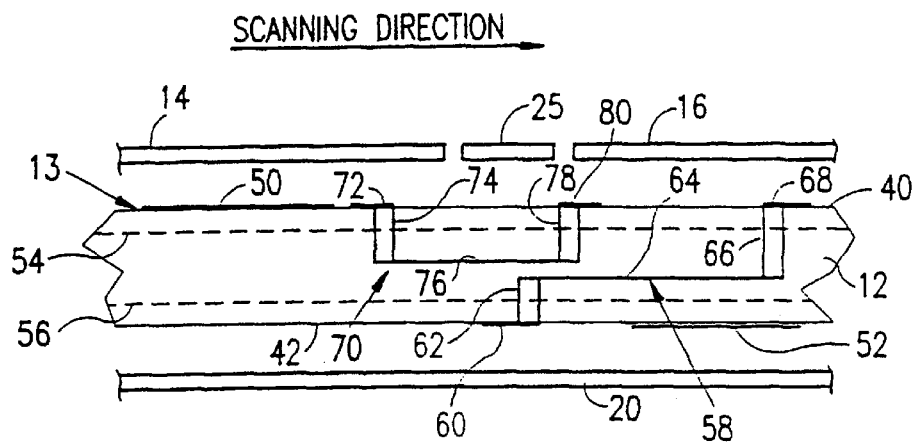
FIG. 2 is a schematic cross-sectional illustration of a simplified BUT together with stimulators and sensors in accordance with a preferred embodiment of the present invention, taken along line II—II in FIG. 1.

Reference is now made to FIG. 2, which is a schematic cross-sectional illustration of a typical arrangement of conductors 13 of a simplified BUT 12 together with stimulators 14, 16 and 20 and sensors 25 (FIG. 1). In the illustrated example BUT 12 has a first surface 40 and a second surface 42, opposite to first surface 40, and comprises several electrical conductors 13, including:

(I) a conductor 50 located entirely along first surface 40;

(II) a conductor 52 located entirely along second surface 42;

(III) a first metal plane 54 located intermediate first and second surfaces 40 and 42, which is preferably grounded during testing;

(IV) a second metal plane 56 located intermediate first metal plane 54 and second surface 42, which is preferably grounded during testing;

(V) a conductor 58, including a first portion 60 extending along second surface 42 and being connected through a plated via hole 62 to a second portion 64 located intermediate first metal plane 54 and second metal plane 56, which is in turn connected through a plated via hole 66 to a third portion 68, which extends along first surface 40;

(VI) a conductor 70, including a first portion 72 extending along first surface 40 and being connected through a plated via hole 74 to a second portion 76 located intermediate first metal plane 54 and second metal plane 56, which is in turn connected through a plated via hole 78 to a third portion 80, which extends along first surface 40.

It is appreciated that the there may be only a single metal plane or a multiplicity of metal planes, for example grounding planes, power planes or shielding, in a BUT. Conventionally, metal layers are not grounded, so that when a BUT is stimulated, a complex pattern of superimposed potentials of the ungrounded metal layer and conductors is produced. However, if a metal layer separating the first and second surfaces of the BUT is grounded, a potential is not induced in the metal layer. Moreover, the metal layer normally isolates sensors from measuring potentials in conductors in a non-contact manner on those portions of the conductors which are situated across the grounded metal layer from the sensor.

As described in greater detail hereinbelow with reference to FIGS. 4A–11B, first side stimulators 14 and 16 stimulate conductors having portions that extend above a first metal plane 54 and along first surface 40 adjacent thereto, such as conductors 50, 58 and 70 in FIG. 2. Similarly second side stimulator 20 stimulates conductors having portions that extend below metal plane 56 and along second surface 42, such as conductors 52 and 58 in FIG. 2. It is a particular feature of a preferred embodiment of the present invention that by stimulating on both sides of the BUT, all conductors having at least one portion that is not sandwiched between two internal metal layers are stimulated and potentials thereon are sensed.

It is appreciated that sensors 25 are able to sense potentials on conductor portions extending along first surface 40 or therebelow down to grounded first metal plane 54. Sensors 25 are not able to sense potential on other conductor portions. In general, the BUT is preferably grounded when performing electrical testing in various layers comprising a multi-layered BUT. Thus, normally following testing of a BUT in the orientation illustrated in FIG. 2, the BUT is turned upside down and tested again, with sensors 25 adjacent second surface 42. When BUT 12 is in this orientation, sensors 25 are able to sense potentials on conductor portions extending along second surface 42 or therebelow down to second metal plane 56. It is appreciated that potentials on conductor portions lying intermediate second metal plane 56 and first metal plane 54 normally cannot be sensed in a non contact manner when the second metal plane 56 and first metal plane 54 are grounded.

It is also appreciated potentials on conductors which extend entirely in a direction perpendicular to the scanning direction indicated in FIG. 2 may not be adequately sensed. For this reason, normally following testing of a BUT in the orientation illustrated in FIG. 2, the BUT is rotated by 90 degrees and tested again, such that all of the conductors are rotated by 90 degrees with respect to the scanning direction. It is thus appreciated that full testing of a BUT 12 preferably involves four passes through the apparatus of FIG. 1.

Figure 3:
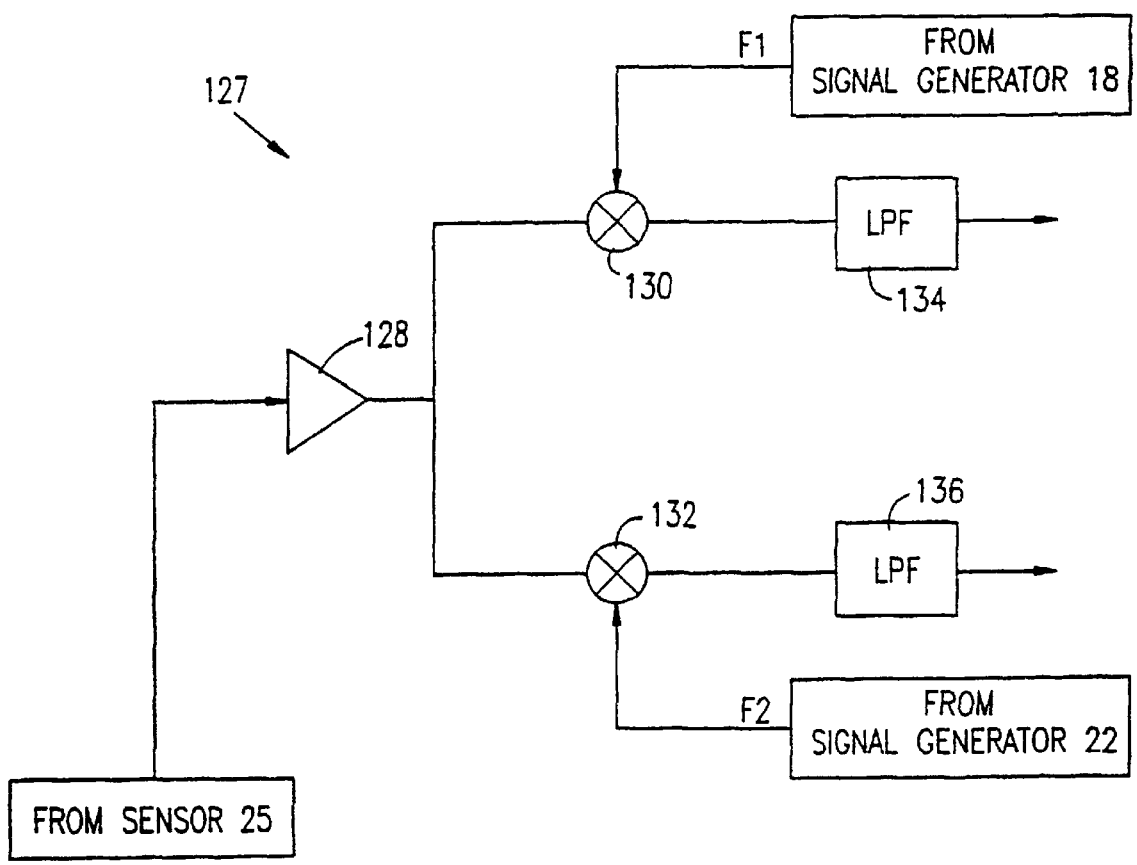
FIG. 3 is a schematic circuit diagram of an exemplary circuit useful as part of a separating detector forming part of the hardware of FIG. 1.

Reference is now made to FIG. 3, which is a schematic circuit diagram of a preferred embodiment of a separating circuit 127 in separating detector 26 (FIG. 1). An output from sensor 25 is supplied to an amplifier 128, which outputs to first and second mixers 130 and 132 which receive respective frequency inputs F1 and F2 from signal generators 18 and 22 respectively (FIG. 1). The outputs of mixers 130 and 132 are supplied to respective low-pass filters (LPF) 134 and 136, respectively. The outputs of the mixers 130 and 132 are DC voltages proportional to the amplitudes of the respective F1 or F2 frequency components of the output from sensor 25 and a an undesirable AC out-band signal obtained as result from mixing of the components of the frequencies F1 and F2. The LPFs 134 and 136 remove the undesirable AC signal portion and provide the resultant DC voltages, one relating to a signal of frequency F1 and the other relating to a signal of frequency F2, to signal analyzer 28, preferably via an A/D converter (not shown). Preferably, a separating circuit 127 may be provided for each sensor 25 in array 24, however, it is appreciated that signals from sensors 25 may be multiplexed to a lesser number of separating circuits 127.

The first side stimulators 14 and 16 preferably generate signals of the same frequency F1, but which are 180 degrees out of phase with each other. The signal component at frequency F1 sensed by sensor 25 at any particular sampling location is the sum of the potentials induced in the conductors 13 by stimulators 14 and 16. The amplitude and phase of this signal component depends on the location of the conductors relative to the locations of the first side stimulators 14 and 16. Alternatively, the first side stimulators 14 and 16 can be energized in-phase with each other.

Figure 4A:
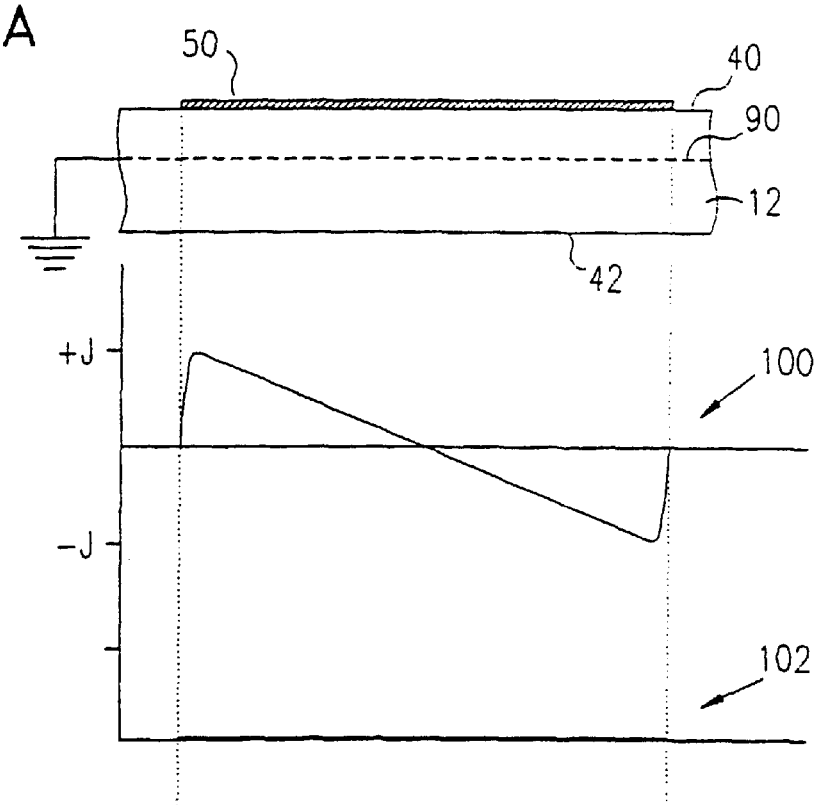
FIGS. 4A and 4B are simplified illustrations of unbroken and broken conductors extending entirely along a first surface of a BUT in spatial registration with a diagrams of potentials sensed thereon.

Reference is now made to FIG. 4A which shows electrical potentials, sensed by a sensor 25 (FIG. 2) lying above first surface 40 of a BUT 12, induced in a typical conductor, such as conductor 50 shown in FIG. 2, which extends along first surface 40, by an electromagnetic field generated by first side stimulators 14 and 16 and second side stimulator 20 in the arrangement of FIG. 2. In FIG. 4A, at least one grounded metal layer 90, such as a ground plane or a power plane, extends between first and second surfaces 40 and 42 of BUT 12.

FIG. 4A includes a representation of conductor 50 arranged in spatial registration with a first diagram 100 of the potential thereon, induced by stimulators 14 and 16 and sensed by sensor 25, as a function of the position along conductor 50 of the midpoint between stimulators 14 and 16 along the scanning direction shown in FIG. 2 and a second diagram 102 of the potential on conductor 50 induced by stimulator 20 as a function of the position along conductor 50 of a sensor 25 along the scanning direction shown in FIG. 2.

It is seen in diagram 100 that as the conductor 50 is scanned in the scanning direction by stimulators 14 and 16 operating in a 180 degree out of phase mode, the potential on the conductor 50 induced by stimulators 14 and 16 goes quickly from a zero value up to a positive value +J and then decreases to a negative value −J, and thereafter returns quickly to zero. It is appreciated that in this and other diagrams hereinbelow, if the phase relationship of the stimulators is reversed then the order in which positive and negative values are obtained is also reversed.

It is also seen in diagram 102 that as the conductor 50 is scanned in the scanning direction by a sensor 25 lying above first surface 40, the potential on the conductor 50 induced by stimulator 20 remains zero inasmuch as conductor 50 is not stimulated by stimulator 20 since it extends only along first surface 40, which is isolated from stimulator 20 adjacent to second surface 42 by at least one grounded metal layer 90.

It is appreciated that conductor 50 shown in FIG. 4A is continuous and has no breaks therealong.

Figure 4B:
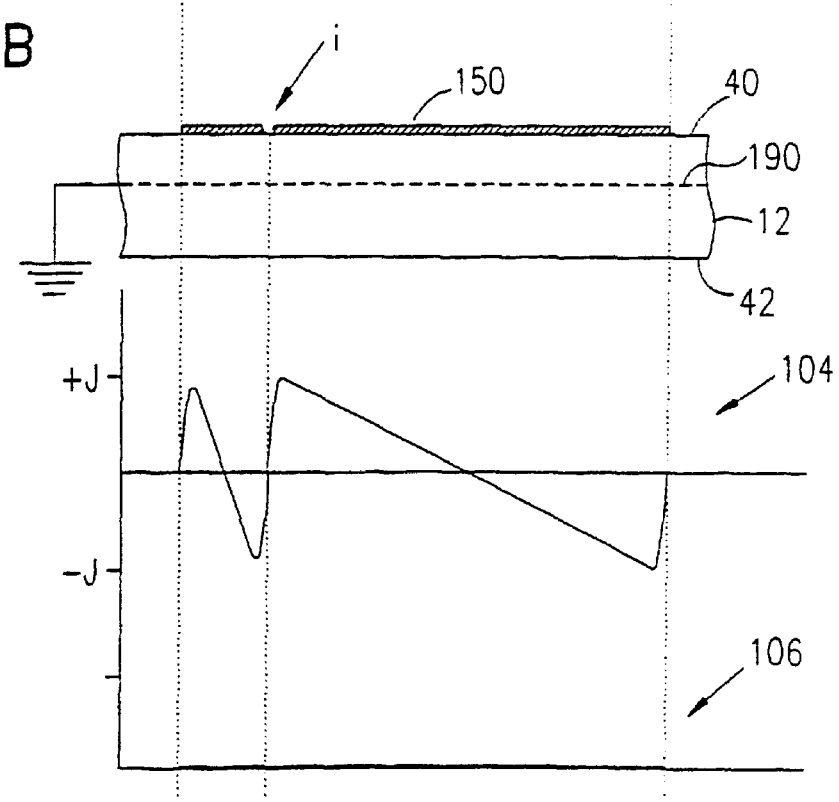

Reference is now made to FIG. 4B, which is identical to FIG. 4A but relates to a conductor 150, identical to conductor 50, except in that it has a break at a location "i" therealong. FIG. 4B shows electrical potentials induced in conductor 150, extending along first surface 40 of a BUT 12 in the environment of FIG. 2, by an electromagnetic field generated by first side stimulators 14 and 16 and second side stimulator 20 in the arrangement of FIG. 2. In FIG. 4B, at least one grounded metal layer 190, such as a ground plane or a power plane, extends between first and second surfaces 40 and 42 of BUT 12.

FIG. 4B includes a representation of conductor 150 arranged in spatial registration with a first diagram 104 of the potential thereon induced by stimulators 14 and 16 and sensed by a sensor 25 as a function of the position along conductor 150 of the midpoint between stimulators 14 and 16 along the scanning direction shown in FIG. 2 and a second diagram 106 of the potential on conductor 150 induced by stimulator 20 as a function of the position along conductor 150 of sensor 25 along the scanning direction shown in FIG. 2.

It is seen that as the conductor 150 is scanned in the scanning direction by stimulators 14 and 16 operating in a 180 degree out of phase mode, the potential on the conductor 150 induced by stimulators 14 and 16 goes quickly from zero up to a positive value +J and then decreases to a negative value −J, and thereafter returns quickly to zero at location "i". From location "i", in the scanning direction, the potential on the conductor 150 induced by stimulators 14 and 16 again goes quickly from zero up to a positive value +J and then decreases to a negative value −J and thereafter returns quickly to zero at the end of conductor 150. It is appreciated that there is a clear and measurable difference in the potential pattern produced in broken conductor 150 as compared with that in continuous conductor 50.

It is also seen from diagram 106 that as the conductor 150 is scanned in the scanning direction by a sensor 25, the potential on the conductor 150 induced by stimulator 20 remains zero inasmuch as conductor 150 is not stimulated by stimulator 20 since it extends only along first surface 40 which is isolated from second surface 42 by at least one grounded metal layer 190. Thus inasmuch as conductor 150 does not include any portion extending below grounded metal plane, the stimulator 20 does not have any effect in detecting a break in conductor 150.

Figure 5A:
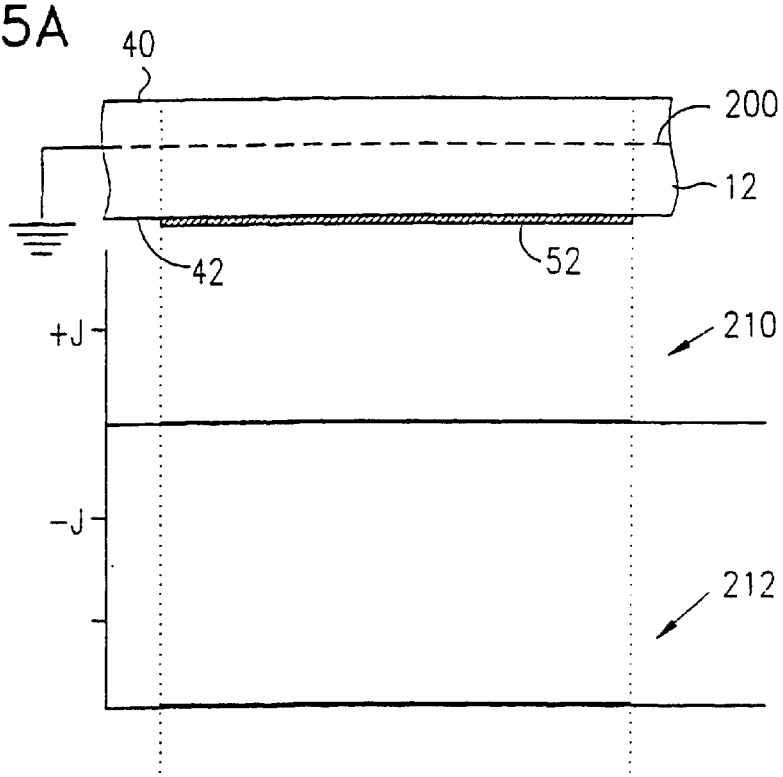
FIGS. 5A and 5B are simplified illustrations of unbroken and broken conductors extending entirely along a second surface of a BUT in spatial registration with diagrams of potentials sensed thereon.

Reference is now made to FIG. 5A which shows potentials, sensed by a sensor 25 (FIG. 2) lying above first surface 40, induced in a typical conductor, such as conductor 52 shown in FIG. 2, which extends along second surface 42 of BUT 12, by an electromagnetic field generated by first side stimulators 14 and 16 and second side stimulator 20 in the arrangement of FIG. 2.

In the embodiment of FIG. 5A, at least one grounded metal layer 200, such as a ground plane or a power plane, extends between first and second surfaces 40 and 42 of BUT 12.

FIG. 5A includes a representation of conductor 52 arranged in spatial registration with a first diagram 210 of the potential thereon induced by stimulators 14 and 16 as a function of the position along conductor 52 of the midpoint between stimulators 14 and 16 along the scanning direction shown in FIG. 2 and a second diagram 212 of the potential on conductor 52 induced by stimulator 20 as a function of the position along conductor 52 of sensor 25 along the scanning direction shown in FIG. 2.

It is seen that as the conductor 52 is scanned in the scanning direction by stimulators 14 and 16 operating in a 180 degree out of phase mode, the potential on the conductor 52 induced by stimulators 14 and 16 is zero, inasmuch as conductor 52 is not stimulated by stimulators 14 and 16 since it extends only along second surface 42, which is isolated from stimulators 14 and 16 by at least one grounded metal layer 200.

It is also seen that as the conductor 52 is scanned in the scanning direction by sensor 25 lying above first surface 40, the potential on the conductor 52 as sensed by sensor 25 remains zero inasmuch as conductor 52 does not have any portion that extends above grounded metal layer 200.

It is appreciated that in order for the system of FIG. 2 to test a conductor such as conductor 52 for continuity, BUT 12 must be turned upside down and tested again, in which case its characteristics are the same as those of conductor 50 shown in FIG. 4A.

Figure 5B:
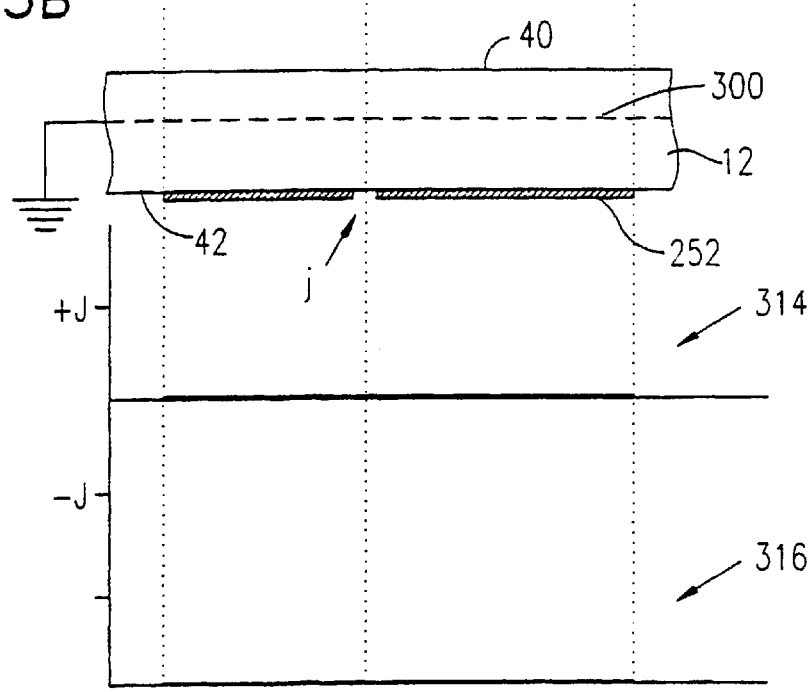

Reference is now made to FIG. 5B, which is identical to FIG. 5A but relates to a conductor 252, identical to conductor 52, except in that it has a break at a location "j" therealong. FIG. 5B shows electrical potentials induced in conductor 252 in the environment of FIG. 2, extending along first surface 42 of BUT 12, by an electromagnetic field generated by first side stimulators 14 and 16 and second side stimulator 20 in the arrangement of FIG. 2. In FIG. 5B, at least one grounded metal layer 300, such as a ground plane or a power plane, extends between first and second surfaces 40 and 42 of BUT 12.

FIG. 5B includes a representation of conductor 252 arranged in spatial registration with a first diagram 314 of the potential thereon, sensed by a sensor 25 lying above first surface 40, induced by stimulators 14 and 16 as a function of the position along conductor 252 of the midpoint between stimulators 14 and 16 along the scanning direction shown in FIG. 2 and a second diagram 316 of the potential on conductor 252 induced by stimulator 20 as a function of the position along conductor 252 of sensor 25 along the scanning direction shown in FIG. 2.

It is seen in diagram 314 that as the conductor 252 is scanned in the scanning direction by stimulators 14 and 16 operating in a 180 degree out of phase mode, the potential on the conductor 252 induced by stimulators 14 and 16 is zero, inasmuch as conductor 252 is not stimulated by stimulators 14 and 16 since it extends only along second surface 42, which is isolated from first surface 40 by at least one grounded metal layer 300.

It is also seen in diagram 316 that as the conductor 252 is scanned in the scanning direction by sensor 25 lying above first surface 40, the potential on the conductor 252 as sensed by sensor 25 remains zero inasmuch as conductor 252 does not have any portion that extends above grounded metal layer 300.

It is appreciated that in order for the system of FIG. 2 to test a conductor such as conductor 252 for continuity, BUT 12 must be turned upside down and tested again, in which case its characteristics are the same as those of conductor 52 shown in FIG. 4B.

It is thus appreciated that the system of the embodiment of FIG. 2 does not provide any information regarding breaks in conductors which lie entirely along second surface 42 or entirely below grounded metal layer 300, unless the BUT is turned upside down and tested again.

Figure 6A:
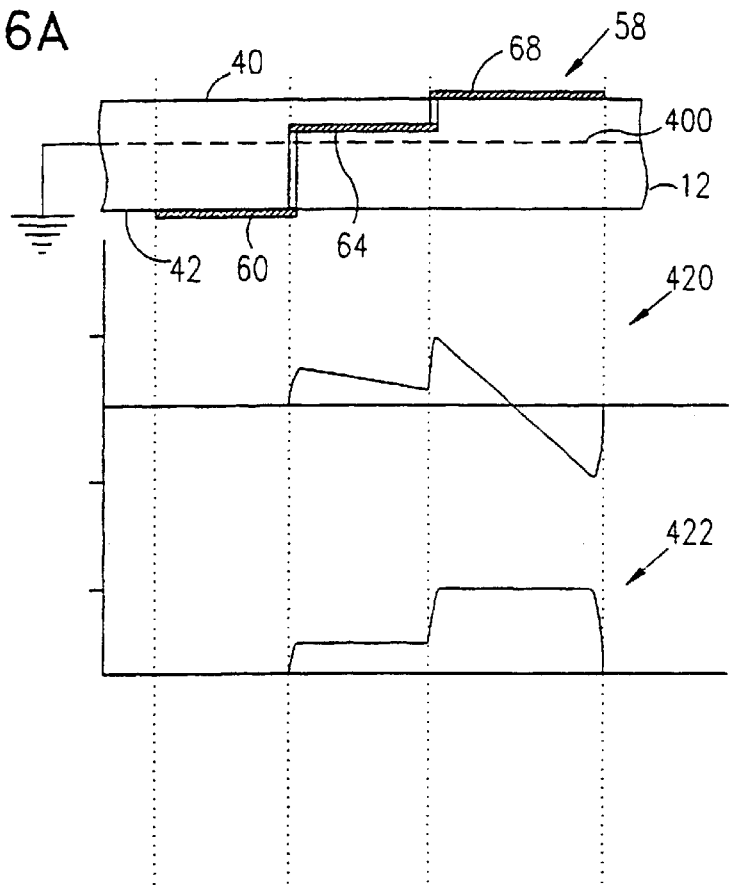
FIGS. 6A–6D are simplified illustrations of unbroken and broken conductors having a portion extending along a first surface of a BUT, a portion extending through intermediate parts thereof, and a portion extending along a second surface thereof, in spatial registration with diagrams of potentials sensed thereon.

Reference is now made to FIG. 6A which shows electrical potentials induced in a typical conductor, such as conductor 58 which includes first portion 60 which extends along second surface 42, second portion 64 located intermediate a grounded metal layer 400, and first surface 40, and third portion 68, which extends along first surface 40 of BUT 12. The electrical potentials are induced by an electromagnetic field generated by first side stimulators 14 and 16 and second side stimulator 20 in the arrangement of FIG. 2 and are sensed by a sensor 25 lying above first surface 40.

FIG. 6A includes a representation of conductor 58, which does not have any breaks therealong, arranged in spatial registration with a first diagram 420 of the potential thereon induced by stimulators 14 and 16 as a function of the position along conductor 58 of the midpoint between stimulators 14 and 16 along the scanning direction shown in FIG. 2 and a second diagram 422 of the potential on conductor 58 induced by stimulator 20 as a function of the position along conductor 58 of a sensor 25 along the scanning direction shown in FIG. 2.

It is seen in diagram 420 that as the conductor 58 is scanned in the scanning direction by stimulators 14 and 16 operating in a 180 degree out of phase mode, the potential on conductor 58 induced by stimulators 14 and 16 initially remains at a zero value inasmuch as conductor 58 extends below grounded metal layer 400. When sensor 25 in the arrangement of FIG. 2 reaches second portion 64, which extends above grounded metal layer 400 but below first surface 40, the sensed potential goes quickly from a zero value up to a first positive value and then upon reaching the end of second portion 64 decreases to a second positive value which is less than the first positive value. Upon reaching third portion 68, the sensed potential increases quickly to a third positive value, which is greater than the first positive value, and then goes to a negative value, the amplitude which is greater than the amplitude of the third positive value, and thereafter returns quickly to zero. It is appreciated that when the midpoint of the stimulators 14 and 16 is over second portion 64, the maximum strength of the potential sensed is less than the maximum strength of the potential sensed when the midpoint of the stimulators 14 and 16 is over third portion 68, thus contributing to the difference in relative amplitudes.

Turning now to diagram 422, it is seen that inasmuch as conductor 58 includes first portion 60 which is located on second side 42 adjacent to second side stimulator 20 (FIG. 2), a potential is induced in conductor 58 by stimulator 20 along the entire length of conductor 58. As seen in diagram 422, because sensor 25 only measures the potential induced on the conductor 58 when the sensor 25 is adjacent to those portions thereof which are above grounded metal layer 400, when sensor 25 is over first section 60 no potential is sensed. Potential is sensed when sensor 25 is situated over second portion 64 and over third portion 68, however because second portion 64 is located at a relatively greater distance from sensor 25 the amplitude of the sensed potential is less than the amplitude sensed when sensor 25 is situated over third section 68.

Figure 6B:
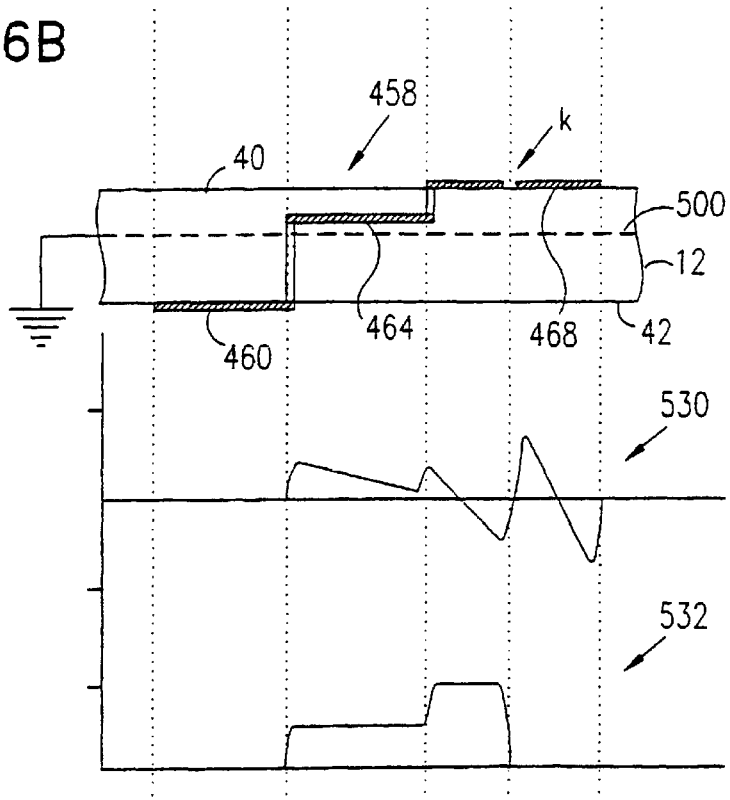

Reference is now made to FIG. 6B, which is identical to FIG. 6A but relates to a conductor 458, identical to conductor 58, except in that it has a break at a location "i" therealong. FIG. 6B shows electrical potentials induced in conductor 458 in the environment of FIG. 2. Conductor 458 includes a first portion 460 which extends along second surface 42, a second portion 464 located intermediate a grounded metal layer 500 and first surface 40, and a third portion 468, which extends along first surface 40 and has a break therein at location "i" as shown. An electromagnetic field is generated by first side stimulators 14 and 16 and second side stimulator 20 in the arrangement of FIG. 2 and electrical potential on conductor 458 is sensed by sensor 25 (FIG. 2) which lies above first surface 40.

FIG. 6B includes a representation of conductor 458 arranged in spatial registration with a first diagram 530 of the potential thereon induced by stimulators 14 and 16 as a function of the position along conductor 458 of the midpoint between stimulators 14 and 16 along the scanning direction shown in FIG. 2 and a second diagram 532 of the potential on conductor 458 induced by stimulator 20 as a function of the position along conductor 458 of a sensor 25 along the scanning direction shown in FIG. 2.

It is seen in diagram 530 that as the conductor 458 is scanned in the scanning direction by stimulators 14 and 16 operating in a 180 degree out of phase mode, the potential on the conductor 458 induced by stimulators 14 and 16 remains at a zero value inasmuch as conductor 458 extends below grounded metal layer 500. When sensor 25 in the arrangement of FIG. 2 reaches second portion 464, which extends above grounded metal layer 500, the sensed potential goes quickly from a zero value up to a first positive value and then at the end of second portion 464 decreases to a second positive value, the value which is less than the first positive value. Upon reaching third portion 468, the sensed potential increases quickly to a third positive value, which is greater than the second positive value, and then goes to a negative value and thereafter returns quickly to zero at location "i". From location "i", in the scanning direction, the potential on the conductor 458 induced by stimulators 14 and 16 goes quickly from zero up to a positive value and then decreases quickly to a negative value and there after returns quickly to zero at the end of conductor 458.

It is appreciated that there is a clear and measurable difference in the potential pattern produced in broken conductor 458 as compared with that produced in continuous conductor 58.

Turning now to diagram 532, it is see that inasmuch as conductor 458 includes first portion 460 which is located on second side 42 adjacent to second side stimulator as shown in the arrangement of FIG. 2, a potential is induced in conductor 458 along its length until break at location "k". As seen in diagram 532, because sensor 25 only senses the potential induced on the conductor 458 when it is adjacent to the portions thereof which are above grounded metal layer 500, when sensor 25 is situated over first section 460 no potential is sensed. Potential is sensed when sensor 25 is situated over second portion 464 and over third portion 468 until location "k". Because of electrical discontinuity due to the break at location "k", for the section of third portion 468 following the break in the scanning direction, which is not connected to any portion of the conductor 458 extending below grounded metal layer 500, no potential is induced.

Figure 6C:
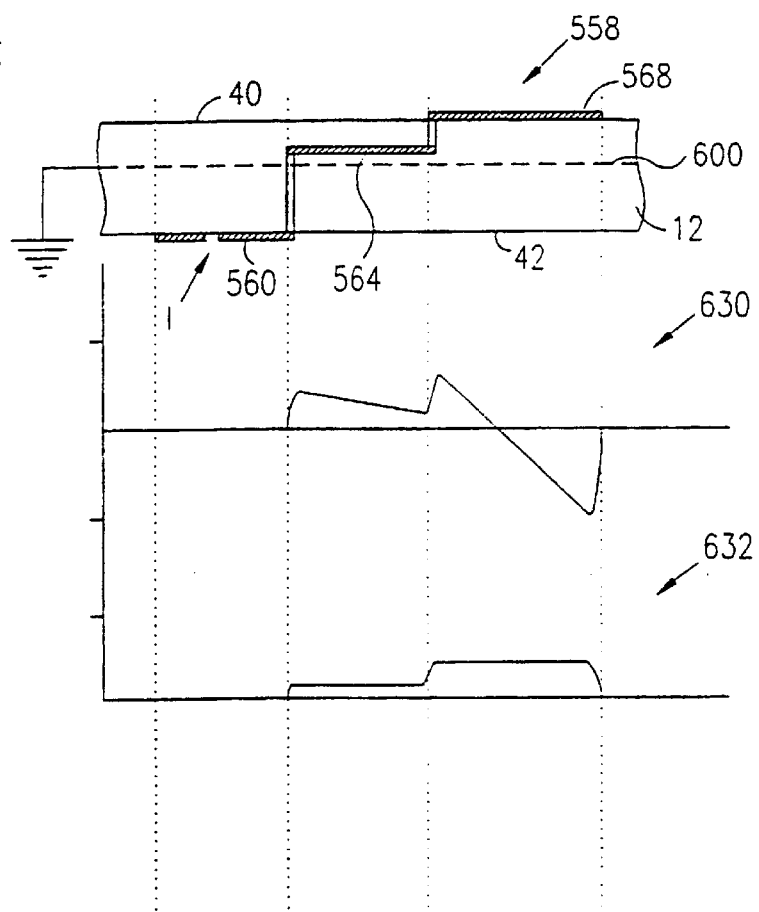

Reference is now made to FIG. 6C, which is identical to FIG. 6A but relates to a conductor 558, identical to conductor 58, except in that it has a break at a location "l" therealong. FIG. 6C shows electrical potentials induced in conductor 558 in the environment of FIG. 2. Conductor 558 includes a first portion 560 which extends along second surface 42, a second portion 564 located intermediate a grounded metal layer 600 and first surface 40, and a third portion 568, which extends along first surface 40. First portion 560 has a break therein as shown. An electromagnetic field is generated by first side stimulators 14 and 16 and second side stimulator 20 in the arrangement of FIG. 2 and electrical potential on conductor 558 is sensed by sensor 25 (FIG. 2) which lies above first surface 40.

FIG. 6C includes a representation of conductor 558 arranged in spatial registration with a first diagram 630 of the potential thereon induced by stimulators 14 and 16 as a function of the position along conductor 558 of the midpoint between stimulators 14 and 16 along the scanning direction shown in FIG. 2 and a second diagram 632 of the potential on conductor 558 induced by stimulator 20 as a function of the position along conductor 558 of a sensor 25 along the scanning direction shown in FIG. 2.

It is seen in diagram 630 that as the conductor 558 is scanned in the scanning direction by stimulators 14 and 16 operating in a 180 degree out of phase mode, the potential on the conductor 558 induced by stimulators 14 and 16 remains at a zero value inasmuch as conductor 558 extends below grounded metal layer 600. When sensor 25 in the arrangement of FIG. 2 reaches second portion 564, which extends above grounded metal layer 600 but below first surface 40, the sensed potential goes quickly from a zero value up to a first positive value and then upon reaching the end of second portion 564 the potential decreases to a second positive value which is less than the first positive value. Upon reaching third portion 568, the sensed potential increases quickly to a third positive value and then goes to a negative value, the amplitude which is greater than the amplitude of the third positive value, and thereafter returns quickly to zero. It is appreciated that because the break at location "l" is in first portion 560 which lies below grounded metal layer 600, the only information about the presence of a break in first portion 560 is provided by the amplitude of the potential sensed at the second and third portions 564 and 568.

Turning now to diagram 632, it is see that inasmuch as conductor 558 includes first portion 560 which is located on second side 42 adjacent to second side stimulator as shown in the arrangement of FIG. 2, despite the break at location "l", some potential is induced in conductor 558 along its length from break until the end of the conductor. As seen in diagram 632, because sensor 25 only measures the potential induced on the conductor 58 when it is adjacent to those portions thereof which are above grounded metal layer 600, when sensor 25 is situated over first section 560 no potential is sensed. Potential is sensed when sensor 25 is situated over second portion 564 and third portion 568, however because of the break at location "i" reduces the effective size of first portion 560 stimulated by stimulator 20, less potential is induced in conductor 568, as compared to the potential induced in corresponding unbroken conductor 58. It is appreciated that the difference may be small and difficult to measure.

Figure 6D:
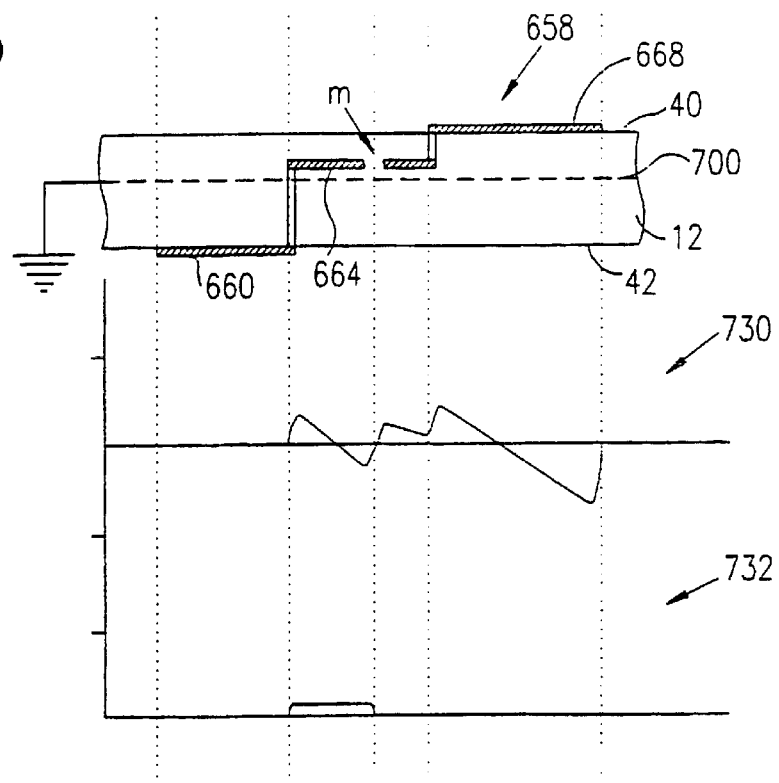

Reference is now made to FIG. 6D, which is identical to FIG. 6A but relates to a conductor 658, identical to conductor 58, except in that it has a break at a location "m" therealong. FIG. 6D shows electrical potentials induced in conductor 658 in the environment of FIG. 2. Conductor 658 includes a first portion 660 which extends along second surface 42 below a grounded metal layer 700, a second portion 664 located intermediate grounded metal layer 700 and first surface 40, and a third portion 668, which extends along first surface 40. A break is shown at location "m" in second portion 664. An electromagnetic field is generated by first side stimulators 14 and 16 and second side stimulator 20 in the arrangement of FIG. 2 and electrical potential on conductor 658 is sensed by sensor 25 (FIG. 2) which lies above first surface 40.

FIG. 6D includes a representation of conductor 658 arranged in spatial registration with a first diagram 730 of the potential thereon induced by stimulators 14 and 16 as a function of the position along conductor 658 of the midpoint between stimulators 14 and 16 along the scanning direction shown in FIG. 2 and a second diagram 732 of the potential on conductor 658 induced by stimulator 20 as a function of the position along conductor 658 of a sensor 25 along the scanning direction shown in FIG. 2.

It is seen in diagram 730 that as the conductor 658 is scanned in the scanning direction by stimulators 14 and 16 operating in a 180 degree out of phase mode, the potential on the conductor 658 induced by stimulators 14 and 16 remains at a zero value inasmuch as first portion 660 of conductor 658 extends below grounded metal layer 700. When sensor 25 in the arrangement of FIG. 2 reaches second portion 664, which extends above grounded metal layer 700, the sensed potential goes quickly from a zero value up to a relatively small first positive value decreases to a relatively small negative value the amplitude of which is generally the same as the first positive value quickly increases to 0 at the break at location m. From location "m" in the scanning direction, the sensed potential quickly increases to a second relatively small third positive value, and then decreases to a third positive value at the end of second portion 664. From the beginning of the third portion 668 in the scanning direction, the sensed potential quickly increases to a fourth positive value, and decreases to a negative value, the amplitude of which is greater than the fourth positive value, and then quickly increases to zero at the end of conductor 658.

It is appreciated that there is a clear and measurable difference in the potential pattern produced in broken conductor 658 as compared with the potential pattern produced in continuous conductor 58.

Turning now to diagram 732, it is seen that inasmuch as conductor 658 includes first portion 660 which is located on second side 42 adjacent to second side stimulator 20 as shown in the arrangement of FIG. 2, a potential is induced in conductor 658 along its length until break at location "m". As seen in diagram 732, because sensor 25 only measures the potential induced on the conductor 658 when the sensor is adjacent to those portions which are above grounded metal layer 700, when sensor 25 is situated over first section 660 no potential is sensed. Potential is sensed when sensor 25 is situated over second portion 664 until location "m". Because of the electrical discontinuity due to the break at location "m", for the second section of second portion 664 in the environment of FIG. 2 following the break at location "m" in the scanning direction and for third portion 668, neither of which have any part extending below grounded metal layer 700, no potential is induced.

It is appreciated that there is a clear and measurable difference in the potential pattern produced in broken conductor 658 as compared with continuous conductor 58.

Figure 7A:
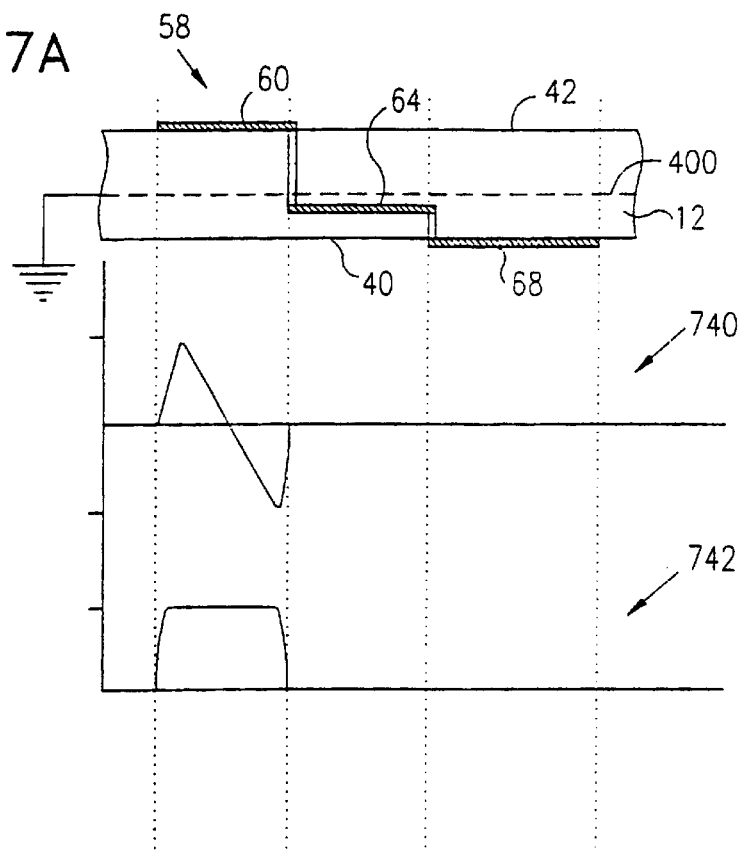
FIGS. 7A–7D are simplified illustrations of the unbroken and broken conductors shown in FIGS. 6A–6D, but in upside-down testing orientation, in spatial registration with diagrams of potentials sensed thereon.

Reference is now made to FIG. 7A, which includes a representation of a conductor 58 shown in FIG. 6A in which BUT 12 is turned upside down for additional testing. Sensor 25 in the arrangement of FIG. 2 now lie above second surface 42 of BUT 12.

FIG. 7A shows electrical potentials induced in conductor 58 which, as indicated hereinabove with reference to FIG. 6A, includes first portion 60 which extends along second surface 42, second portion 64 located intermediate grounded metal layer 400 and first surface 40, and third portion 68, which extends along first surface 40. The electrical potentials are induced by an electromagnetic field generated by first side stimulators 14 and 16, which now lie above second surface 42, and second side stimulator 20, which now lies below first surface 40, and are sensed by a sensor 25 lying above first surface 42.

FIG. 7A includes a representation of conductor 58, which does not have any breaks therealong, arranged in spatial registration with a first diagram 740 of the potential thereon induced by stimulators 14 and 16 as a function of the position along conductor 58 of the midpoint between stimulators 14 and 16 along the scanning direction shown in FIG. 2 and a second diagram 742 of the potential on conductor 58 induced by stimulator 20 as a function of the position along conductor 58 of sensor 25 along the scanning direction shown in FIG. 2.

It is seen in diagram 740 that as the conductor 58 is scanned in the scanning direction by stimulators 14 and 16 operating in a 180 degree out of phase mode, the potential on conductor 58 induced by stimulators 14 and 16 goes quickly from a zero value to a positive value and then decreases to a negative value, of the same amplitude as the positive value, at the end of first portion 60, and quickly returns to a zero value. Inasmuch as second portion 64 and third portion 68 are below grounded metal layer 400, the potential remains at a zero value.

As conductor 58 includes third portion 64 which is located on first side 40, now adjacent to second side stimulator 20 as shown in the arrangement of FIG. 2, a potential is induced in conductor 58 by stimulator 20 along the entire length of conductor 58. As seen in diagram 740, because sensor 25 only measures the potential induced on the conductor 58 when the sensor 25 is adjacent to those portions which are above grounded metal layer 400, a potential is sensed over first portion 60. When sensor 25 is over second portion 64 and third portion 68, no potential is sensed.

Figure 7B:
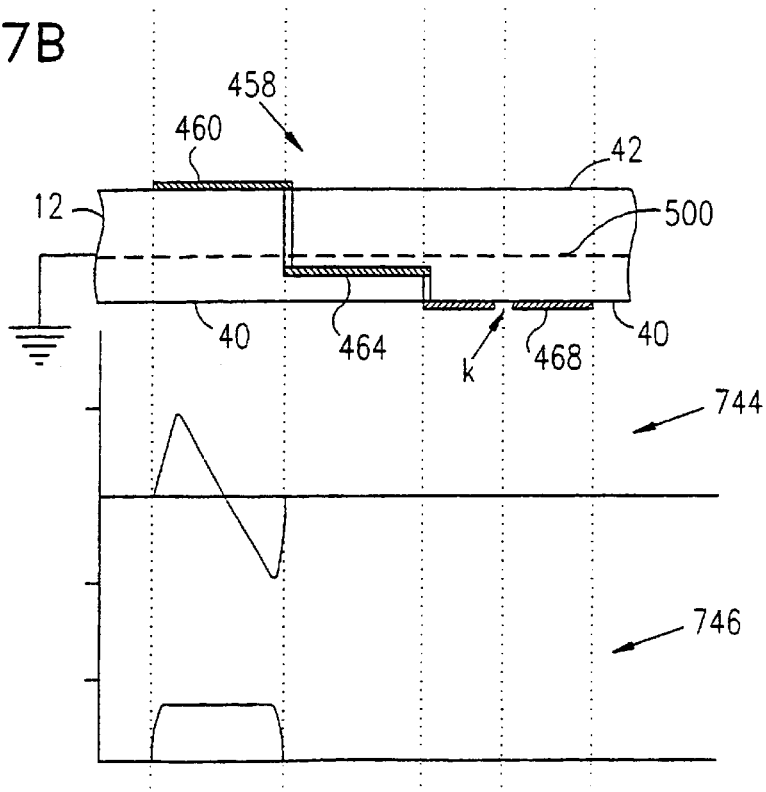

Reference is now made to FIG. 7B, which includes a representation of broken conductor 458 shown in FIG. 6B except that it is turned upside down for additional testing such that sensors 25 in the arrangement of FIG. 2 now lie above second surface 42.

FIG. 7B shows the electrical potential induced in conductor 458 which is identical to conductor 58 in FIG. 7A except that it includes a break at position "k". As indicated hereinabove with reference to FIG. 7A, conductor 458 includes first portion 460 which extends along second surface 42, second portion 464 located intermediate a grounded metal layer 500 and first surface 40, and third portion 468, which extends along first surface 40 of BUT 12. The break at a location "k" is situated in third portion 468. The electrical potential is induced by an electromagnetic field generated by first side stimulators 14 and 16, which now lie above second surface 42, and second side stimulator 20, which now lies below first surface 40, and are sensed by sensor 25 lying above second surface 42.

FIG. 7B includes a representation of conductor 458, arranged in spatial registration with a first diagram 744 of the potential thereon induced by stimulators 14 and 16 as a function of the position along conductor 458 of the midpoint between stimulators 14 and 16 along the scanning direction shown in FIG. 2 and a second diagram 746 of the potential on conductor 458 induced by stimulator 20 as a function of the position along conductor 458 of sensor 25 along the scanning direction shown in FIG. 2.

It is seen in diagram 744 that as the conductor 458 is scanned in the scanning direction by stimulators 14 and 16 operating in a 180 degree out of phase mode, the potential on the conductor 458 induced by stimulators 14 and 16 goes quickly from a zero value to a positive value, decreases to a negative value, of the same amplitude as the positive value, and quickly returns to a zero value at the end of first portion 460. Inasmuch as second portion 464 and third portion 468 are below grounded metal layer 500, the potential of these portions sensed by sensor 25 remains at a zero value.

Turning now to diagram 746, it is seen that inasmuch as conductor 458 includes second portion 464 which is located beneath metal plane 600 and third portion 468 which is located on first side 40, now adjacent to second side stimulator 20 as shown in the arrangement of FIG. 2, a potential is induced in conductor 458 by stimulator 20 along the entire length of conductor 458. However, because of the break at location "k", the potential is somewhat reduced relative to the potential induced by unbroken third portion 68 (FIG. 7A).

As seen in diagram 746, because sensor 25 only measures the potential induced on the conductor 458 when the sensor is adjacent to those portions which are above grounded metal layer 500, a somewhat reduced potential is sensed over first portion 460, however when sensor 25 is over second portion 464 and third portion 468, no potential is sensed. It is appreciated that there may be only small differences in the potential induced by stimulator 20 in the configurations of FIG. 7A and FIG. 7B respectively, and that it may be difficult to differentiate between these differences.

It is appreciated that when tested in the "upside-down" orientation of FIGS. 7A and 7B the difference in the potential patterns produced in broken conductor 458 as compared with the potential patterns induced in continuous conductor 58, namely the amplitude of the potential induced by stimulator 20, may be difficult to measure.

Figure 7C:
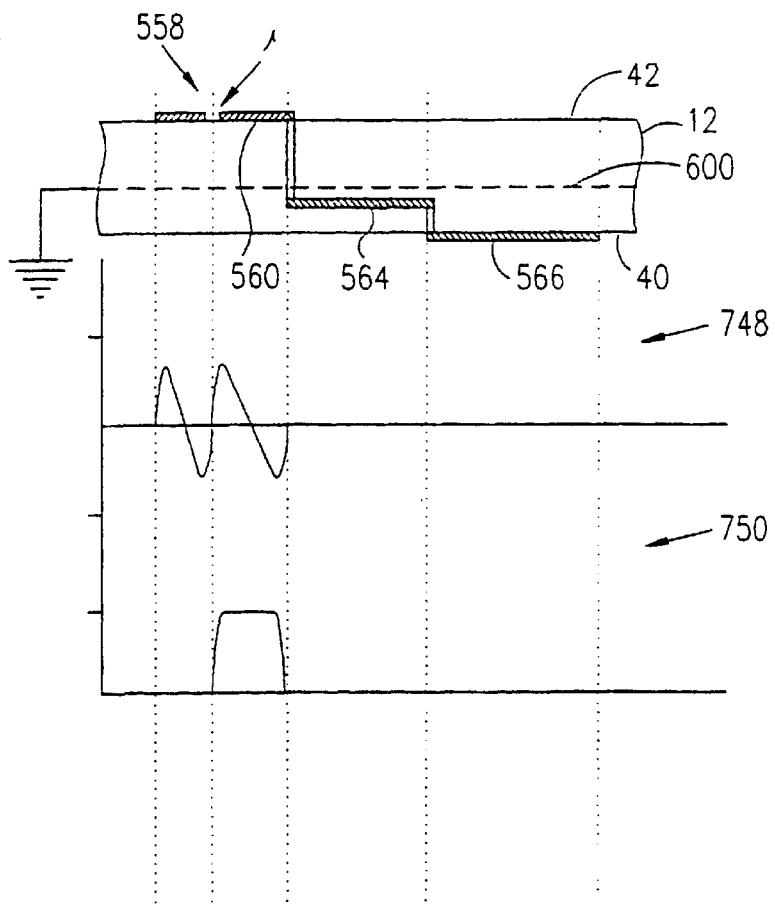

Reference is now made to FIG. 7C, which includes a representation of conductor 558 shown in FIG. 6C except that it is turned "upside-down" such that sensor 25 in the arrangement of FIG. 2 now lies above second surface 42 of BUTT 12.

FIG. 7C shows the electrical potential induced in conductor 558 which is identical to conductor 58 in FIG. 7A except that it includes a break at position "l". As indicated hereinabove with reference to FIG. 7A, conductor 558 includes a first portion 560 which extends along second surface 42, a second portion 564 located intermediate a grounded metal layer 600 and first surface 40, and a third portion 568, which extends along first surface 40. A break at a location "l" is situated in first portion 560. The electrical potentials are induced by an electromagnetic field generated by first side stimulators 14 and 16, which now lie above second surface 42, and by second side stimulator 20, which now lies below first surface 40, and are sensed by sensor 25 lying above first surface 42.

FIG. 7C includes a representation of conductor 558 arranged in spatial registration with a first diagram 748 of the potential thereon induced by stimulators 14 and 16 as a function of the position along conductor 558 of the midpoint between stimulators 14 and 16 along the scanning direction shown in FIG. 2 and a second diagram 750 of the potential on conductor 558 induced by stimulator 20 as a function of the position along conductor 558 of a sensor 25 along the scanning direction shown in FIG. 2.

It is seen in diagram 748 that as the conductor 558 is scanned in the scanning direction by stimulators 14 and 16 operating in a 180 degree out of phase mode, the potential on the conductor 558 induced by stimulators 14 and 16 goes quickly from zero up to a first positive value and then decreases to a negative value the amplitude of which is the same as the first positive value, and thereafter returns quickly to zero at location "l". From location "l", in the scanning direction shown in FIG. 2, the potential on the conductor 558 induced by stimulators 14 and 16 again goes quickly from zero up to the first positive value and then decreases to a negative value and thereafter returns quickly to zero at the end of first portion 560. Inasmuch as second portion 564 and third portion 568 are below grounded metal layer 600, the measured potential thereon remains at a zero value.

Turning now to diagram 750, it is see that inasmuch as conductor 558 includes a second portion 564 and a third portion 568 which are beneath grounded metal layer 600, now adjacent to second side stimulator 20 as shown in the arrangement of FIG. 2, a potential is induced in conductor 558 by stimulator 20. However, as seen in diagram 750, because of a break at location "l", from the beginning of first portion 560 in the scanning direction of FIG. 2 until the break at location "l", no potential is induced by bottom stimulator 20. Because sensor 25 only measures the potential induced on the conductor 558 when adjacent to those portions which are above grounded metal layer 600, a potential is only sensed over first portion 560 from the break at location "l" in the scanning direction of FIG. 2 until the end of first portion 560. When sensor 25 is over second portion 564 and third portion 568, which are beneath grounded metal layer 600, no potential is sensed.

It is appreciated that there are a clear and measurable differences in the potential patterns produced in broken conductor 558 as compared with the potential patterns produced in continuous conductor 58, as sensed by sensor 25.

Figure 7D:
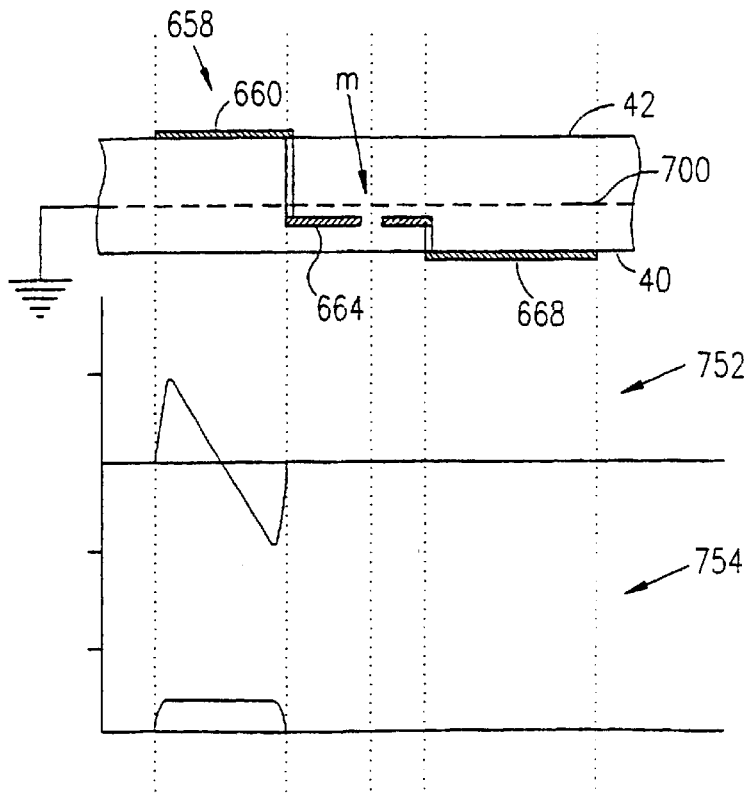

Reference is now made to FIG. 7D, which includes a representation of conductor 658 shown in FIG. 6D except that it is turned "upside-down" such that sensor 25 in the arrangement of FIG. 2 now lies above second surface 42 of BUT 12.

FIG. 7D shows the electrical potential induced in conductor 658, which is identical to conductor 58 in FIG. 7A except that it includes a break at location "m". As indicated hereinabove with reference to FIG. 7A, conductor 658 includes a first portion 660 which extends along second surface 42, a second portion 664 located intermediate a grounded metal layer 600 and first surface 40, and a third portion 668, which extends along first surface 40. A break at a location "m" is shown in second portion 664. An electromagnetic field is generated by first side stimulators 14 and 16 and second side stimulator 20 in the arrangement of FIG. 2 and electrical potential on conductor 658 is sensed by sensor 25 (FIG. 2) which lies above first surface 40.

FIG. 7D includes a representation of conductor 658 arranged in spatial registration with a first diagram 752 of the potential thereon induced by stimulators 14 and 16 as a function of the position along conductor 658 of the midpoint between stimulators 14 and 16 along the scanning direction shown in FIG. 2 and a second diagram 754 of the potential on conductor 658 induced by stimulator 20 as a function of the position along conductor 658 of sensor 25 along the scanning direction shown in FIG. 2.

It is seen in diagram 752 that as the conductor 658 is scanned in the scanning direction by stimulators 14 and 16 operating in a 180 degree out of phase mode, the potential on the conductor 658 induced by stimulators 14 and 16 goes quickly from zero up to a first positive value and then decreases to a negative value, the amplitude of which is the same as the first positive value, and thereafter returns quickly to zero at the end of first portion 660. Inasmuch as second portion 664 and third portion 668 are below grounded metal layer 600, the measured potential remains at a zero value.

Turning to diagram 754, it is seen that conductor 658 includes second portion 664 which is beneath metal plane 600 and third portion 664 which is located on first surface 40, now adjacent to second side stimulator 20 as shown in the arrangement of FIG. 2. A break is shown at location "m" in second portion 664. A relatively small potential is induced in conductor 658 by stimulator 20 along the first section of second portion 664 in the scanning direction of FIG. 2, and this relatively small potential is sensed by sensor 25 when adjacent to first portion 660. A potential is also induced in the second section of second portion 664 in the scanning direction shown in FIG. 2, and in third portion 668, however when sensor 25 is over these portions, which are beneath grounded metal layer 600, no potential is sensed thereby.

It is appreciated that when conductor 658 of FIG. 6D is tested in the "upsidedown" orientation of FIG. 7D, the difference in the potential patterns produced in broken conductor 658 as compared with the potential patterns produced in continuous conductor 58 in the orientation of FIG. 7A, namely the amplitude of the potential induced by stimulator 20, may be difficult to measure.

Figure 8A:
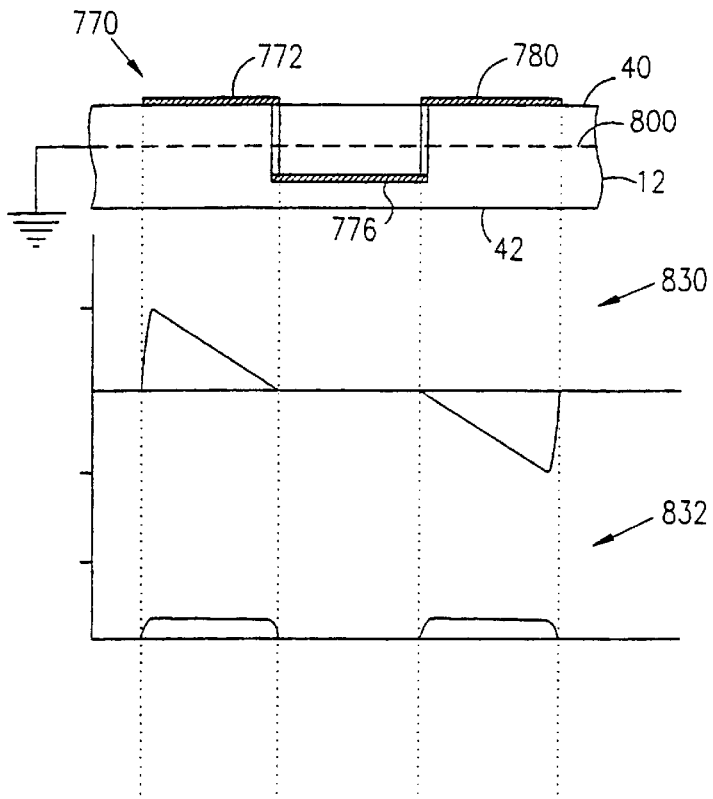
FIGS. 8A–8C are simplified illustrations of unbroken and broken conductors having a portion extending along a first surface of a BUT, a portion extending through intermediate parts thereof, and another portion extending along the first surface thereof, in spatial registration with diagrams of potentials sensed thereon.

Reference is now made to FIG. 8A which shows electrical potentials induced in a typical conductor, such as a conductor 770 which includes a first portion 772 which extends along first surface 40, a second portion 776 located intermediate a grounded metal layer 800 and second surface 42, and a third portion 780, which extends along first surface 40 of BUT 12. The electrical potentials are induced by an electromagnetic field generated by first side stimulators 14 and 16 and second side stimulator 20 in the arrangement of FIG. 2 and are sensed by sensor 25 lying above first surface 40. FIG. 8A includes a representation of conductor 770, which does not have any breaks therealong, arranged in spatial registration with a first diagram 830 of the potential thereon induced by stimulators 14 and 16 as a function of the position along conductor 770 of the midpoint between stimulators 14 and 16 along the scanning direction shown in FIG. 2 and a second diagram 832 of the potential on conductor 770 induced by stimulator 20 as a function of the position along conductor 770 of sensor 25 along the scanning direction shown in FIG. 2.

It is seen in diagram 830 that as the conductor 770 is scanned in the scanning direction by stimulators 14 and 16 operating in a 180 degree out of phase mode, the potential on conductor 770 induced by stimulators 14 and 16 quickly goes to a positive value at beginning of first portion 772 and decreases to zero at the end of first portion 772. Inasmuch as second portion 776 is beneath grounded metal layer 800, no potential is sensed while sensor 25 is over second portion 776, and the potential value remains zero.

Progressing in the scanning direction indicated in FIG. 2, as sensor 25 reaches third portion 780, the potential decreases to a negative value and then goes to zero at the end of third portion 780.

Turning to diagram 832, it is seen that inasmuch as conductor 770 includes second portion 776 which is located beneath grounded metal layer 800 adjacent to second side stimulator 20 as shown in the arrangement of FIG. 2, a relatively small potential is induced in conductor 770 by stimulator 20 along the entire length of conductor 770. As seen in diagram 832, because sensor 25 only measures the potential induced on the conductor 770 when sensor 25 is adjacent to those portions which are above grounded metal layer 800, when sensor 25 is over first portion 772 and third portion 780, a relatively small potential is sensed. Inasmuch as second portion 776 is situated beneath grounded metal layer 800, no potential is sensed when sensor 25 is situated over second portion 776 of BUT 12.

Figure 8B:
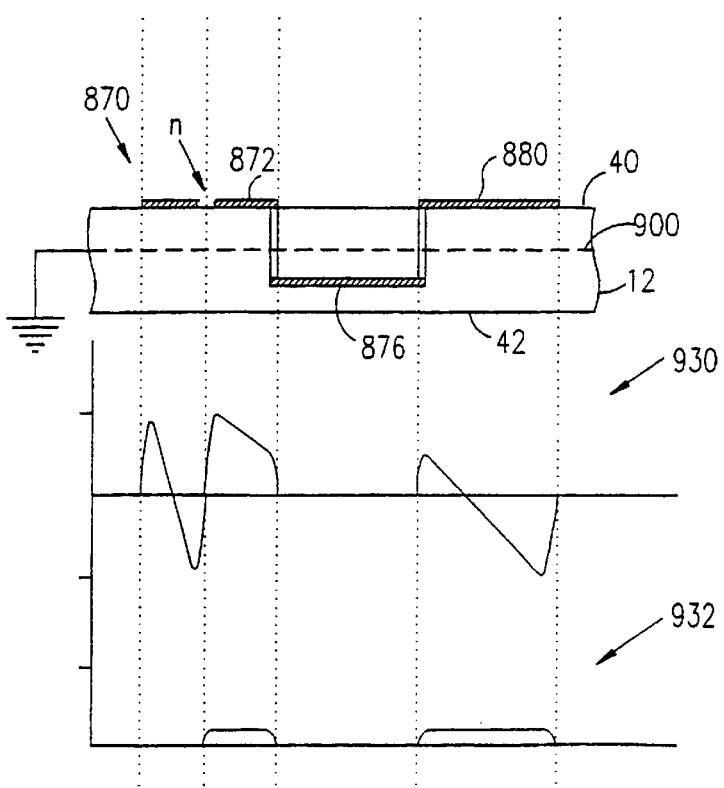

Reference is now made to FIG. 8B, which is identical to FIG. 8A but relates to a conductor 870, identical to conductor 70, except in that it has a break at a location "n" therealong. FIG. 8B shows electrical potentials induced in conductor 870 in the environment of FIG. 2. Conductor 870 includes a first portion 872 which extends along first surface 40, and has a break as shown, a second portion 876 located intermediate a grounded metal layer 900 and second surface 42, and a third portion 880, which extends along first surface 40. The electrical potentials are induced by an electromagnetic field generated by first side stimulators 14 and 16 and second side stimulator 20 in the arrangement of FIG. 2 and are sensed by sensor 25 lying above first surface 40.

FIG. 8B includes a representation of conductor 870 arranged in spatial registration with a first diagram 930 of the potential thereon induced by stimulators 14 and 16 as a function of the position along conductor 870 of a sensor 25 situated between stimulators 14 and 16 along the scanning direction shown in FIG. 2 and a second diagram 932 of the potential on conductor 870 induced by stimulator 20 as a function of the position along conductor 870 of sensor 25 along the scanning direction shown in FIG. 2.

It is seen in diagram 930 that as the conductor 870 is scanned in the scanning direction by stimulators 14 and 16 operating in a 180 degree out of phase mode, the potential on the conductor 870 induced by stimulators 14 and 16 quickly goes to a first positive value, decreases to a negative value and returns to zero at the break at location "n". From location "n" in the scanning direction indicated in FIG. 2, the potential on conductor 870 quickly goes to a second positive value, and decreases to a third positive value and quickly returns to zero at the end of first portion 872. Inasmuch as second portion 876 is beneath grounded metal layer 900, no potential is sensed while sensor 25 is over second portion 776, and the potential value remains zero. At the beginning of third portion 880, in the scan direction of FIG. 2, the potential quickly goes to the third positive value, then decreases to a negative value and quickly increases to zero at the end of third portion 880.

Turning to diagram 932, it is seen that inasmuch as conductor 870 includes second portion 876 which is located beneath grounded metal layer 900 adjacent to second side stimulator 20 as shown in the arrangement of FIG. 2, a relatively small potential is induced in conductor 870 by stimulator 20 along conductor 870 from the break at location "n" until the end of third portion 880. As seen in diagram 832, because of the electrical discontinuity resulting from the break at location "n", no potential is induced in first portion 872 up to break at location "n" along the scanning direction. Sensor 25 measures the potential induced on the conductor 870 when it is adjacent to those portions which are above grounded metal layer 900. When sensor 25 is over first portion 872, after location "n" in the scanning direction, and third portion 880, a relatively small potential is sensed. Inasmuch as second portion 876 is situated beneath grounded metal layer 900, no potential is sensed when sensor 25 is situated over second portion 876 of BUT 12.

Figure 8C:
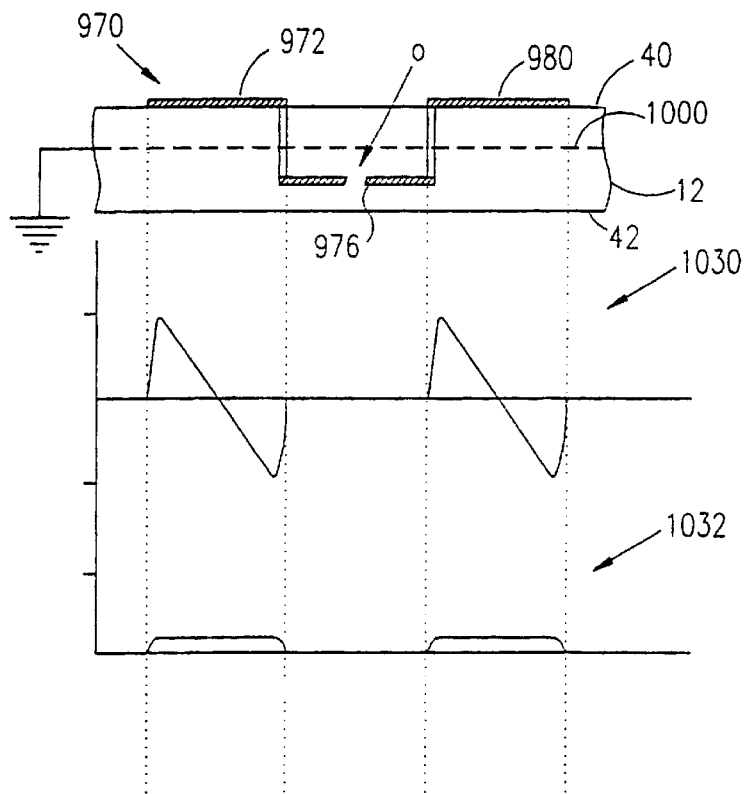

Reference is now made to FIG. 8C, which is identical to FIG. 8A but relates to a conductor 970, identical to conductor 770, except in that it has a break at a location "o" therealong. FIG. 8C shows electrical potentials induced in conductor 970 in the environment of FIG. 2. Conductor 970 includes a first portion 972 which extends along first surface 40, a second portion 976 located intermediate a grounded metal layer 1000 and second surface 42, and has a break at location "o" as shown, and a third portion 980, which extends along first surface 40. The electrical potentials are induced by an electromagnetic field generated by first side stimulators 14 and 16 and second side stimulator 20 in the arrangement of FIG. 2 and are sensed by sensor 25 lying above first surface 40.

FIG. 8C includes a representation of conductor 970 arranged in spatial registration with a first diagram 1030 of the potential thereon induced by stimulators 14 and 16 as a function of the position along conductor 970 of the midpoint between stimulators 14 and 16 along the scanning direction shown in FIG. 2 and a second diagram 1032 of the potential on conductor 970 induced by stimulator 20 as a function of the position along conductor 970 of a sensor 25 along the scanning direction shown in FIG. 2.

It is seen in diagram 1030 that as the conductor 970 is scanned in the scanning direction by stimulators 14 and 16 operating in a 180 degree out of phase mode, the potential on the conductor 970 induced by stimulators 14 and 16 quickly goes to a positive value at beginning of first portion 972, decreases to a negative value and quickly returns to zero at the end of first portion 972. Inasmuch as second portion 976 is beneath grounded metal layer 1000, no potential is sensed while sensor 25 is over second portion 976, and the potential value remains zero. Progressing in the scanning direction indicated in FIG. 2, as sensor 25 reaches third portion 980, the potential quickly goes to a positive value at beginning of third portion 980, decreases to a negative value and quickly returns to zero at the end of third portion 980.

Turning to diagram 1032, it is see that inasmuch as conductor 970 includes second portion 976 which is located beneath grounded metal layer 1000 adjacent to second side stimulator 20 as shown in the arrangement of FIG. 2, a relatively small potential is induced in conductor 970 by stimulator 20 along the conductor on either side of break at location "o". As seen in diagram 1032, because sensor 25 only measures the potential induced on the conductor 970 when the sensor is adjacent to those portions of the conductor which are above grounded metal layer 1000, when sensor 25 is over first portion 972 and third portion 980, a relatively small potential is sensed. Inasmuch as second portion 976 is situated beneath grounded metal layer 1000, no potential is sensed when sensor 25 is situated over second portion 976.

Figure 9C:
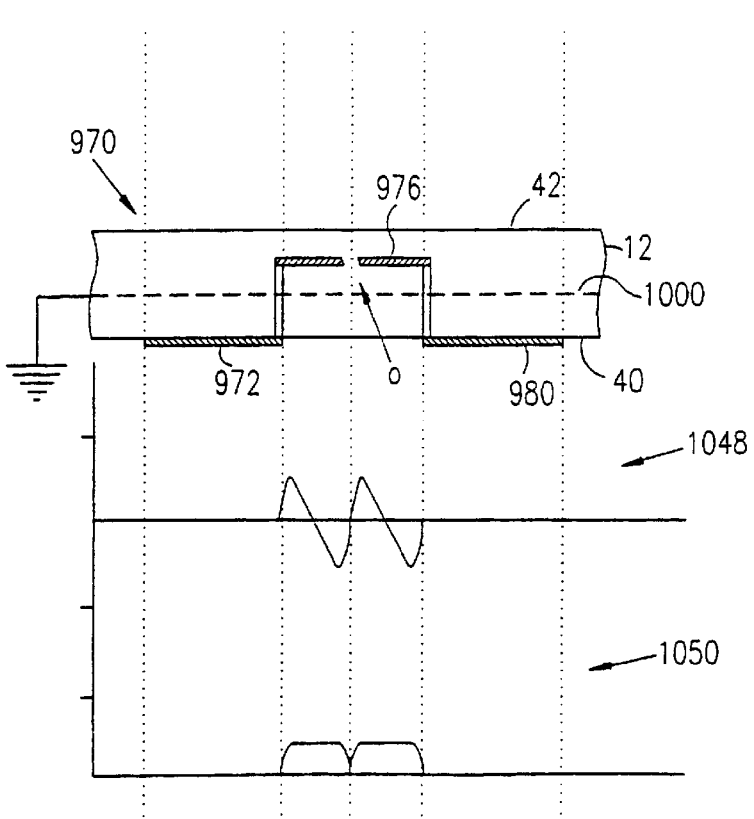
FIGS. 9A–9C are simplified illustrations of the unbroken and broken conductors shown in FIGS. 8A–8C, but in upside-down testing orientation, in spatial registration with diagrams of potentials sensed thereon.
Figure 9A:
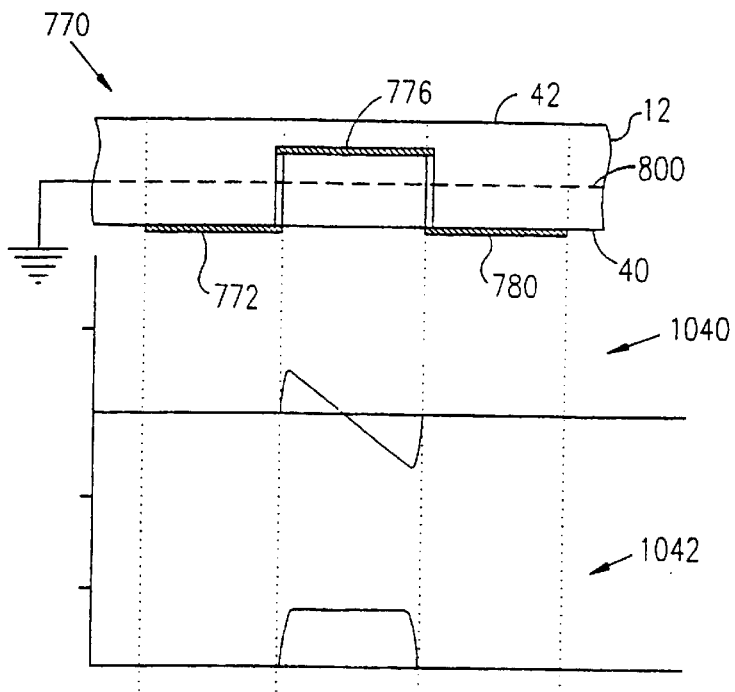

Reference is now made to FIG. 9A, which includes a representation of a conductor 770 shown in FIG. 8A in which BUT 12 is turned "upside-down" for additional testing. Sensors 25 in the arrangement of FIG. 2 now lie above second surface 42 of BUT 12.

FIG. 9A shows electrical potentials induced in conductor 770 which, as indicated hereinabove with reference to FIG. 8A, includes first portion 772 which extends along first surface 40, second portion 776 located intermediate grounded metal layer 800 and second surface 42, and third portion 780, which extends along first surface 40 of BUT 12. The electrical potentials are induced by an electromagnetic field generated by first side stimulators 14 and 16 which now lie above second surface 42, and second side stimulator 20, which now lies below first surface 40, and are sensed by sensor 25 lying above second surface 42.

FIG. 9A includes a representation of conductor 770, which does not have any breaks therealong, arranged in spatial registration with a first diagram 1040 of the potential thereon induced by stimulators 14 and 16 as a function of the position along conductor 770 of sensor 25 situated between stimulators 14 and 16 along the scanning direction shown in FIG. 2 and a second diagram 1042 of the potential on conductor 770 induced by stimulator 20 as a function of the position along conductor 770 of sensor 25 along the scanning direction shown in FIG. 2.

It is seen in diagram 1040 that as the conductor 770 is scanned in the scanning direction by stimulators 14 and 16 operating in a 180 degree out of phase mode, inasmuch as first portion 772 is located beneath grounded metal layer 800, the potential on conductor 770 sensed by sensor 25 when it is above first portion 772 is zero. When sensor 25 reaches second portion 776 the value for the potential sensed quickly goes to a positive value, decreases to a negative value and quickly returns to zero at the end of second portion 776. It is appreciated that potential induced in conductor 770 and sensed when sensor is over second portion 776 is attenuated because second portion 776 is located below, and not on, second surface 42. From the beginning of third portion 780 the sensed value for the potential is zero inasmuch as third portion 780 is beneath the grounded metal layer 800.

Turning to diagram 1042, it is seen that inasmuch as conductor 770 includes first portion 772 and third portion 780 located on first side 40, now adjacent to second side stimulator 20 as shown in the arrangement of FIG. 2, a potential is induced in conductor 770 by stimulator 20 along its entire length. As seen in diagram 1042, because sensor 25 only measures the a potential induced on conductor 770 when it is adjacent to those portions thereof which are above grounded metal layer 800, potential is sensed only over second portion 776, however this potential is relatively small because second portion 776 is situated below, and not on, second surface 42. When sensor 25 is over first portion 772 and third portion 780, no potential is sensed because these portions are below grounded metal layer 800.

Figure 9B:
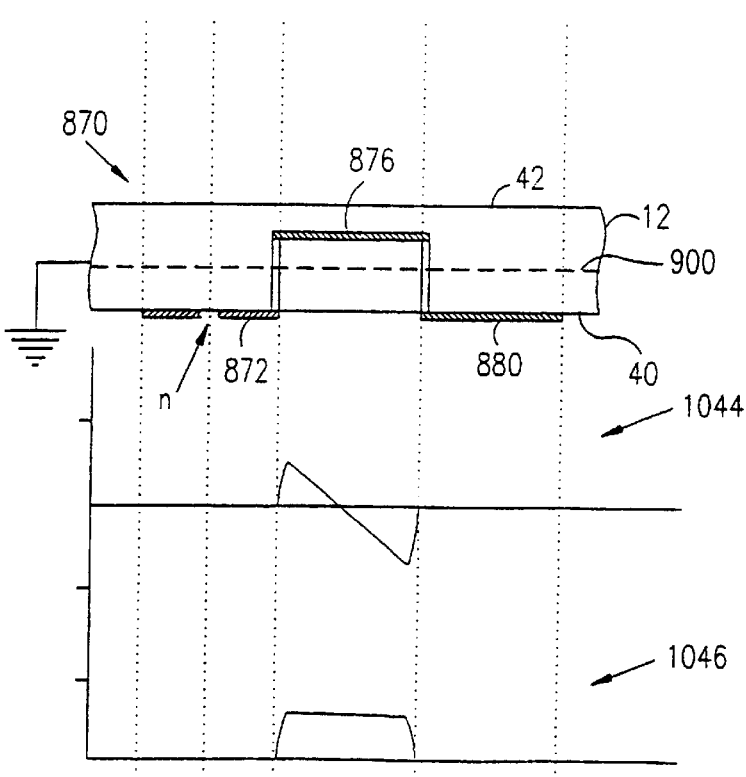

Reference is now made to FIG. 9B, which includes a representation of a conductor 870 shown in FIG. 8B except that it is turned "upside-down" such that sensors 25 in the arrangement of FIG. 2 now lie above second surface 42 of BUT 12.

FIG. 9B shows the electrical potential induced in conductor 870 which is identical to conductor 770 in FIG. 9A except that it includes a break at position "n" therealong. As indicated hereinabove with reference to FIG. 9A, conductor 870 includes a first portion 872 which extends along first surface 40 and has a break therein at location "n" as shown, a second portion 876 located intermediate grounded metal layer 800 and second surface 42, and a third portion 880, which extends along first surface 40. The electrical potentials are induced by an electromagnetic field generated by first side stimulators 14 and 16 which now lie above second surface 42, and second side stimulator 20, which now lies below first surface 40, and are sensed by sensor 25 lying above second surface 42.

FIG. 9B includes a representation of conductor 870, arranged in spatial registration with a first diagram 1044 of the potential thereon induced by stimulators 14 and 16 as a function of the position along conductor 870 of the midpoint between stimulators 14 and 16 along the scanning direction shown in FIG. 2 and a second diagram 1046 of the potential on conductor 870 induced by stimulator 20 as a function of the position along conductor 870 of sensor 25 along the scanning direction shown in FIG. 2.

It is seen in diagram 1044 that as the conductor 870 is scanned in the scanning direction by stimulators 14 and 16 operating in a 180 degree out of phase mode, inasmuch as first portion 872 is located beneath grounded metal layer 800, the potential on conductor 870 sensed by sensor 25 when it is above first portion 872 is zero. When sensor 25 reaches second portion 876 the value for the potential sensed quickly goes to a positive value decreases to a negative value and quickly returns to zero at the end of second portion 876. It is appreciated that potential induced in conductor 870 and sensed when sensor is over second portion 876 is attenuated because second portion 876 is located below, and not on, said second surface 42. From the beginning of third portion 880 the sensed value for the potential is zero inasmuch as third portion is beneath the grounded metal layer.

Turning now to diagram 1046, it is seen that inasmuch as conductor 870 includes first portion 872 and third portion 880 located on first side 40, now adjacent to second side stimulator 20 as shown in the arrangement of FIG. 2, a potential is induced in conductor 870 by stimulator 20. As seen in diagram 1046, because sensor 25 only measures the potential induced on conductor 870 when adjacent to those portions which are above grounded metal layer 800, potential is sensed only over second portion 876, however this potential is relatively small because second portion 876 is situated below, and not on, second surface 42, and is further attenuated because the length of first portion 872 contributing to the potential on conductor 870 is shortened due to break at location "n". When sensor 25 is over first portion 872 and third portion 880, no potential is sensed because these portions are below grounded metal layer 800.

Reference is now made to FIG. 9C, which includes a representation of a conductor 970 shown in FIG. 8C except that it is turned "upside-down" such that sensor 25 in the arrangement of FIG. 2 now lies above second surface 42 of BUT 12.

FIG. 9C shows the electrical potential induced in conductor 970 which is identical to conductor 770 in FIG. 9A except that it includes a break at position "o". As indicated hereinabove with reference to FIG. 9A, conductor 970 includes first portion 972 which extends along first surface 40, second portion 976 located intermediate grounded metal layer 1000 and second surface 42, and has break therein at location "o" as shown, and third portion 980, which extends along first surface 40. The electrical potentials are induced by an electromagnetic field generated by first side stimulators 14 and 16 which now lie above second surface 42, and second side stimulator 20, which now lies below first surface 40, and are sensed by sensor 25 lying above second surface 42.

FIG. 9C includes a representation of conductor 970 arranged in spatial registration with a first diagram 1048 of the potential thereon induced by stimulators 14 and 16 as a function of the position along the conductor 970 of the midpoint between stimulators 14 and 16 along the scanning direction shown in FIG. 2 and a second diagram 1050 of the potential on conductor 970 induced by stimulator 20 as a function of the position along conductor 970 of sensor 25 along the scanning direction shown in FIG. 2.

It is seen in diagram 1048 that as the conductor 970 is scanned in the scanning direction by stimulators 14 and 16 operating in a 180 degree out of phase mode, inasmuch as first portion 972 is located beneath grounded metal layer

1000, the potential on conductor 970 sensed by sensor 25 when the sensor is above first portion 972 is zero. When sensor 25 reaches second portion 976 the value for the potential sensed quickly goes to a positive value decreases to a negative value and quickly returns to zero at the break at location "o". From break at location "o" in the scanning direction as indicated in FIG. 2, the potential sensed quickly returns to a positive value, decreases to a negative value and quickly returns to zero at the end of second portion 976. From the beginning of third portion 980 the sensed value for the potential is zero inasmuch as third portion 980 is beneath the grounded metal layer 1000.

Turning now to diagram 1050, it is seen that inasmuch as conductor 970 includes first portion 972 and third portion 980 located on first side 40, now adjacent to second side stimulator 20 as shown in the arrangement of FIG. 2, a potential is induced in conductor 970 by stimulator 20 along either side of break at location "o". As seen in diagram 1050, because sensor 25 only measures the potential induced on conductor 970 when adjacent to those portions which are above grounded metal layer 1000, the potential is sensed only over second portion 976, however this potential is relatively small because second portion 976 is situated below, and not on, second surface 42. From the beginning of second portion 976 in the direction indicated in FIG. 2, the potential sensed quickly increases to a first positive value, and quickly decreases at location "o" of the break, and thereafter again quickly increases to a positive value and quickly returns to zero at the end of second portion 976. It is appreciated that the extent to which the potential patterns on either side of the break at location "o" are differentiable one from the other is a function of the size of the break. Inasmuch as sensor 25 is over first portion 972 and third portion 980, no potential is sensed because these portions are below grounded metal layer 1000.

Reference is now made to FIGS. 10A, 10B, 11A and 11B which are illustrative of the operation of the apparatus of FIG. 1 to detect shorts between conductors on a BUT 1052 in the environment shown in FIG. 2.

Figure 10A:
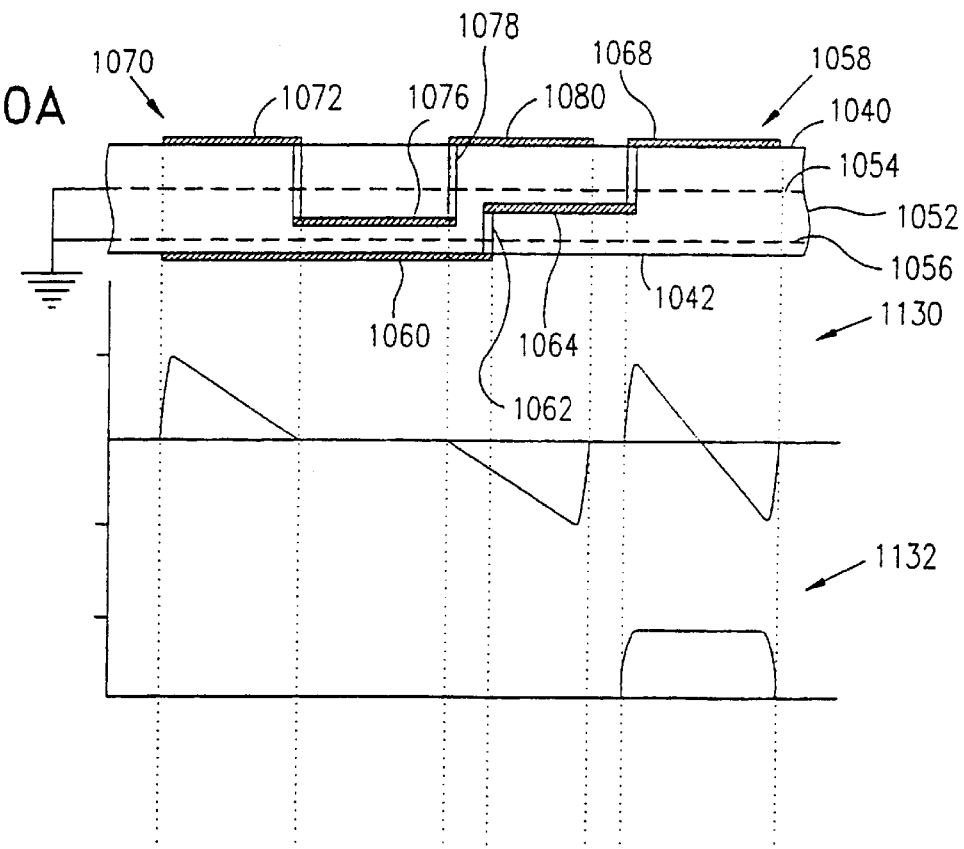
FIGS. 10A–10B are simplified illustrations of two non-shorted and two shorted conductors in spatial registration with diagrams of potentials sensed thereon.

Reference is now made to FIG. 10A which shows electrical potentials induced in typical conductors, such as conductors 58 and 70 in FIG. 2. A conductor 1058 includes a first portion 1060 which extends along a second surface 1042 of BUT 1052, a via hole 1062 connecting between first portion 1060 and a second portion 1064, which is located intermediate grounded metal layers 1054 and 1056, a third portion 1068 which extends along a first surface 1040 of BUT 1052. A conductor 1070 includes a first portion 1072 which extends along first surface 1040, a second portion 1076 located intermediate grounded metal layers 1054 and 1056, a via hole 1078 connection between second portion 1076 and a third portion 1080, which extends along first surface 1040. The electrical potentials are induced by an electromagnetic field generated by first side stimulators 14 and 16 and second side stimulator 20 in the arrangement of FIG. 2 and are sensed by sensor 25 lying above first surface 1040.

FIG. 10A includes a representation of conductors 1058 and 1070 which do not have any breaks therealong, and which are not mutually shorted, arranged in spatial registration with a first diagram 1130 of the potential on conductors 1058 and 1070 induced by stimulators 14 and 16 as a function of the position along conductors 1058 and 1070 of the midpoint between stimulators 14 and 16 along the scanning direction shown in FIG. 2 and a second diagram 1132 of the potential on conductors 1058 and 1070 induced by stimulator 20 as a function of the position along the conductors of sensor 25 along the scanning direction shown in FIG. 2.

It is seen in diagram 1130 that as conductors 1058 and 1070 are scanned in the scanning direction by stimulators 14 and 16 operating in a 180 degree out of phase mode, the potential on conductor 1070 induced by stimulators 14 and 16 quickly goes to a positive value at beginning of first portion 1072 and decreases to zero at the end of first portion 1072. Inasmuch as second portion 1076 lies beneath grounded metal layer 1054, no potential is sensed while sensor 25 is over second portion 1076, and the potential value remains zero. Progressing in the scanning direction indicated in FIG. 2, as sensor 25 reaches third portion 1080, the potential decreases from zero to a negative value and then quickly goes to zero at the end of third portion 1080. Further progressing in the scanning direction of FIG. 2, inasmuch as second portion 1064 of conductor 1058 is beneath grounded metal layer 1054, the zero value is maintained until sensor 25 reaches third portion 1068 of conductor 1058, at which point it quickly increases to a positive value, then decreases to a negative value and quickly increases to zero at the end of conductor 1068.

Turning to diagram 1132, it is see that inasmuch as only first portion 1060 of conductor 1058 and no portion of conductor 1070 is located beneath both grounded metal layers 1054 and 1056, stimulator 20 induces a potential only on conductor 1058, as seen in diagram 1132.

Figure 10B:
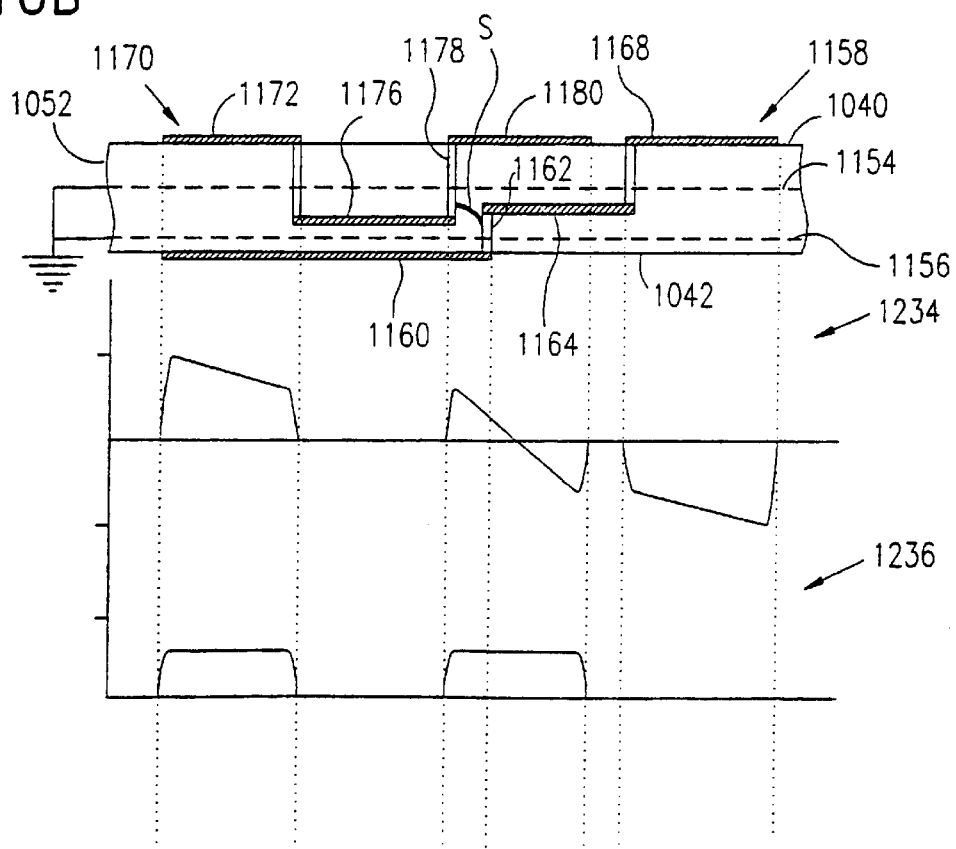

Reference is now made to FIG. 10B, which is identical to FIG. 10A except that conductors 1158 and 1170 are mutually shorted at location "s". FIG. 10B shows electrical potentials induced in conductor 1158 in the environment of FIG. 2. As noted above, conductor 1158 includes a first portion 1160 which extends along second surface 1042, a via hole 1162 connecting between first portion 1160 and second portion 1164 which is located intermediate grounded metal layers 1154 and 1156, and a third portion 1168 which extends along a first surface 1040. Conductor 1170 includes a first portion 1172 which extends along first surface 1040, a second portion 1176 located intermediate grounded metal layers 1154 and 1156, a via hole 1178 connecting between second portion 1176 and third portion 1180, which extends along first surface 1040. Conductors 1158 and 1170 are shorted at location "s" between via hole 1162 of conductor 1158 and via hole 1178 of conductor 1170.

The electrical potentials are induced by an electromagnetic field generated by first side stimulators 14 and 16 and second side stimulator 20 in the arrangement of FIG. 2 and are sensed by sensor 25 lying above first surface 1040.

FIG. 10B includes a representation of conductors 1158 and 1170 which is arranged in spatial registration with a first diagram 1234 of the potential on the conductors induced by stimulators 14 and 16 as a function of the position along the conductors of the midpoint between stimulators 14 and 16 along the scanning direction shown in FIG. 2 and a second diagram 1236 of the potential on conductors 1158 and 1170 induced by stimulator 20 as a function of the position along the conductors of sensor 25 along the scanning direction shown in FIG. 2.

Figure 11A:
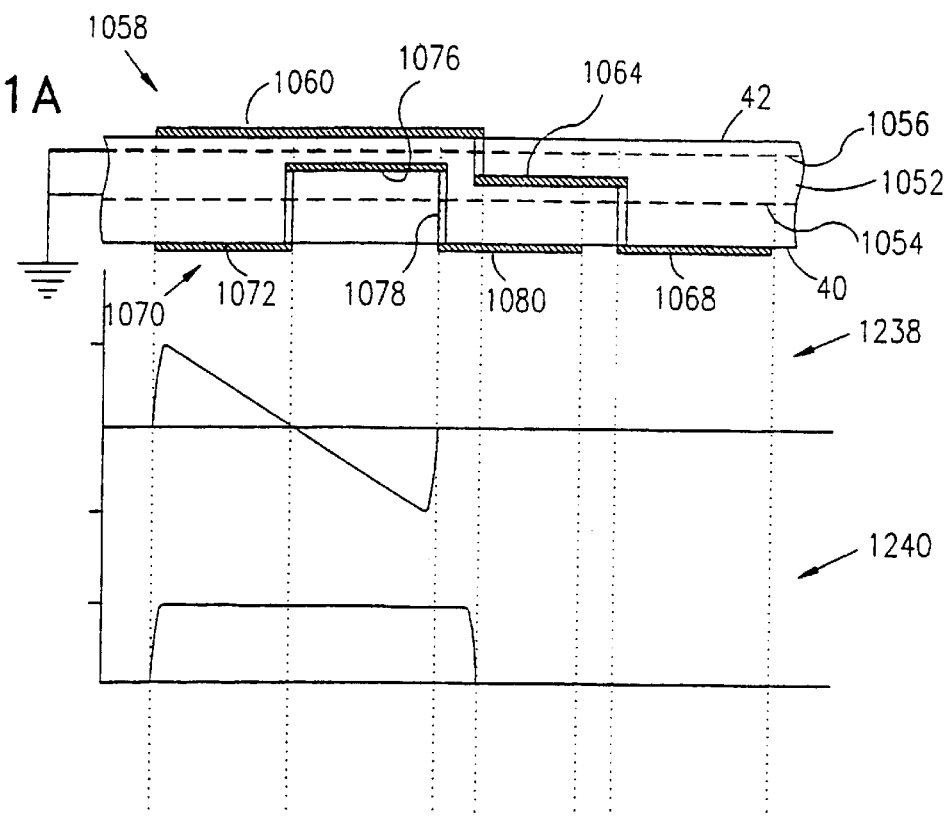
FIGS. 11A–11B are simplified illustrations of the two non-shorted and shorted conductors shown in FIGS. 10A–10B but in upside-down testing orientation, in spatial registration with diagrams of potentials sensed thereon.

Reference is now made to FIG. 11A, which includes a representation of conductors 1058 and 1070 shown in FIG. 10A and in which BUT 12 is turned "upsidedown" for additional testing. Sensor 25 in the arrangement of FIG. 2 now lies above second surface 1042 of BUT 1052.

FIG. 11A shows electrical potentials induced in conductors 1058 and 1070. As indicated hereinabove with reference to FIG. 10A, conductor 1058 includes first portion 1060 which extends along second surface 1042, a via hole 1062 connecting between first portion 106 and second portion 1064, located between grounded metal planes 1054 and 1056, and third portion 1068 which extends along first surface 1040. Conductor 1070 includes first portion 1072 which extends along first surface 1040, second portion 1076 located between grounded metal planes 1054 and 1056 and via hole 1078 connecting second portion 1076 and third portion 1080, which extends along first surface 1040. The electrical potentials are induced by an electromagnetic field generated by first side stimulators 14 and 16 and second side stimulator 20 in the arrangement of FIG. 2 and are sensed by a sensor 25 lying above second surface 1042.

FIG. 11A includes a representation of non-broken and non-shorted conductors 1058 and 1070, arranged in spatial registration with a first diagram 1238 of the potential on the conductors 1058 and 1070, as sensed by sensor 25, induced by stimulators 14 and 16 as a function of the position along the conductors of the midpoint between stimulators 14 and 16 along the scanning direction shown in FIG. 2, and a second diagram 1240 of the potential on conductors 1058 and 1070 induced by stimulator 20 as a function of the position along the conductors of sensor 25 along the scanning direction shown in FIG. 2.

It is seen in diagram 1238 that as conductors 1058 and 1070 are scanned in the scanning direction by stimulators 14 and 16 operating in a 180 degree out of phase mode, the potential on conductor 1070 induced by stimulators 14 and 16, as measured by sensor 25, quickly goes to a positive value at beginning of first portion 1060, decreases to a negative value, and at the end of first portion 1060 quickly increases to zero. It is seen that inasmuch as second portion 1064 and third portion 1068 of conductor 1058, are situated below grounded metal layer 1054, no potential is sensed with respect to potential induced by stimulators 14 and 16 when sensor is over second portion 1064 and third portion 1068. It is also seen that inasmuch as conductor 1070 is situated entirely below grounded metal layer 1054, it is not stimulated by stimulators 14 and 16 when BUT 1052 is tested in the "upside-down" orientation.

Turning now to diagram 1240, it is seen that inasmuch as conductor 1058 includes third portion 1068 which is below grounded metal layer 1056, conductor 1058 is stimulated by stimulator 20. When BUT 1052 is scanned in the scanning direction, when sensor 25 is over first section 1060 the potential induced by stimulator 20 is sensed by sensor 25. Inasmuch as second portion 1064 and third portion 1068 of conductor 1058, are beneath grounded metal layer 1054, sensor 25 does not sense potentials when over these portions. Inasmuch as all of conductor 1070 is beneath grounded metal layer 1054, the potential induced on conductor 1070 is not sensed by sensor 25.

Figure 11B:
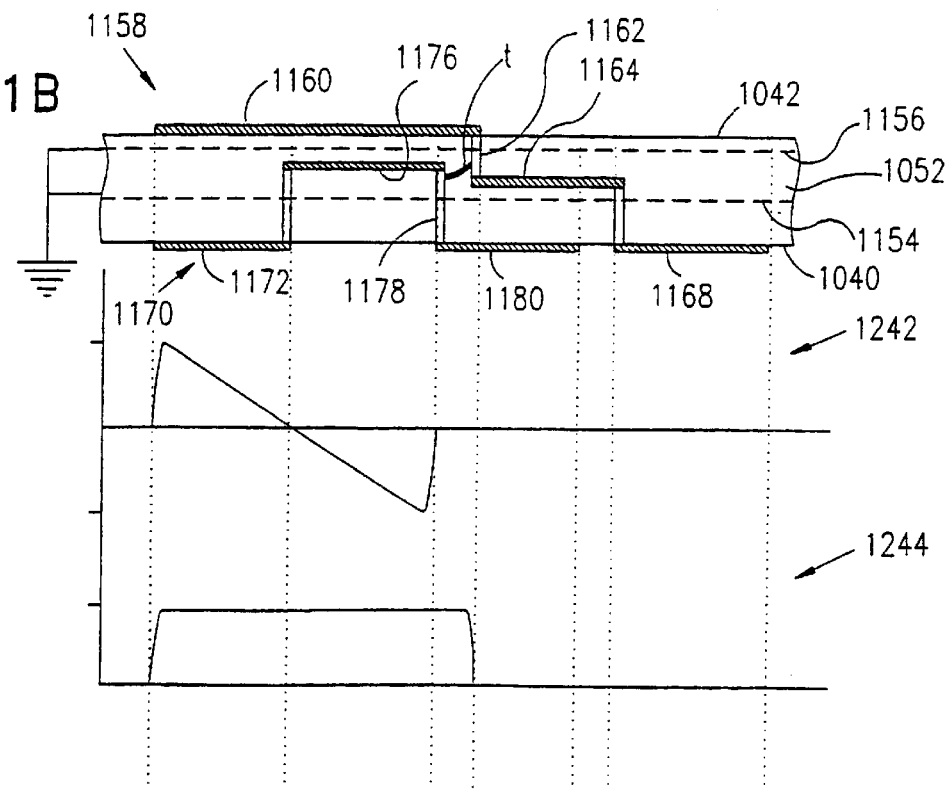

Reference is now made to FIG. 11B, which is identical to FIG. 10B, but refers to testing of BUT 1052 in "upside-down" orientation for testing as shown in FIG. 11A. FIG. 11B shows electrical potentials induced in conductors 1158 and 1170 which are mutually shorted at location "t". As indicated hereinabove with reference to FIG. 10B, conductor 1158 includes first portion 1160 which extends along second surface 1042, a via hole 1162 connecting between first portion 1160 and second portion 1164, located between grounded metal planes 1154 and 1156, and third portion 1168 which extends along first surface 1040 of BUT 1052. Conductor 1170 includes first portion 1172 which extends along first surface 1040, second portion 1176 located between grounded metal planes 1154 and 1156, via hole 1178 connecting between second portion 1176 and third portion 1180, which extends along first surface 1040. A short exists between via hole 1162 of conductor 1158 and via hole 1178 of conductor 1170 at location "t". The electrical potentials are induced by an electromagnetic field generated by first side stimulators 14 and 16 and second side stimulator 20 in the arrangement of FIG. 2 and are sensed by a sensor 25 lying above second surface 1042.

FIG. 11B includes a representation of conductors 1158 and 1170 arranged in spatial registration with a first diagram 1242 of the potential thereon induced by stimulators 14 and 16 as a function of the position along the conductors of the midpoint between stimulators 14 and 16 along the scanning direction shown in FIG. 2 and a second diagram 1244 of the potential on conductors 1158 and 1170 induced by stimulator 20 as a function of the position along the conductors of a sensor 25 along the scanning direction shown in FIG. 2.

It is seen in diagram 1242 that as conductors 1158 and 1170 are scanned in the scanning direction by stimulators 14 and 16 operating in a 180 degree out of phase mode, the potential on conductor 1158 induced by stimulators 14 and 16, as measured by sensor 25, quickly goes to a positive value at beginning of first portion 1160, decreases to a negative value, and at the end of first portion 1160 quickly increases to zero. It is seen that inasmuch as second portion 1164 and third portion 1168 of conductor 1158 are situated below grounded metal layer 1156, no potential is sensed with respect to potential induced by stimulators 14 and 16 when sensor is over second portion 1164 and third portion 1168. It is also seen that inasmuch as conductor 1170 is situated entirely below grounded metal layer 1154, it is not stimulated by stimulators 14 and 16 when BUT 1052 is tested in "upside-down" orientation.

Turning now to diagram 1244, it is seen that inasmuch as conductor 1158 includes third portion 1168, which is below grounded metal layer 1154, conductor 1158 is stimulated by stimulator 20. As BUT 1052 is scanned along the scanning direction, when sensor 25 is over first section 1160 the potential induced by stimulator 20 is sensed. Inasmuch as second portion 1164 and third portion 1168 of conductor 1158, are beneath grounded metal layer 1156, sensor 25 does not sense potentials when it is over these portions. Inasmuch as all of conductor 1170 is beneath grounded metal layer 1154, the potential induced on conductor 1170 is not sensed by sensor 25.

It is appreciated that when testing BUT 1054 in "upside-down" orientation, the potential patterns produced by shorted conductors 1158 and 1170 is substantially.the same as the potential patterns produced by non-shorted conductors 1058 and 1070, Thus in order to identify a short in the BUT 1054, it is necessary to perform electrical testing in "right-side-up" orientation wherein, as seen in FIG. 10B shorted conductors 1158 and 1170 are sensed to have a clear and different potential pattern as compared to non-shorted conductors 1058 and 1070 in FIG. 10A.

It is generally appreciated that the foregoing examples of test results for various BUT configurations are not intended to encompass all testable BUT configurations and defects, but rather they are intended to provide illustrative examples of testing possibilities. Thus, in order to achieve fully robust non-contact electrical testing, such as electrical testing able to test for defects located in-between and across internal metal layers in BUTs, BUTs are preferably non-contact electrically tested using the aforementioned apparatus and methods by applying stimulation and sensing, including applying stimulation to the same side of the BUT from one or more sensors to induce potentials in the conductors; applying stimulation to the opposite side of the BUT from one or more sensors also to induce potentials in conductors, and applying stimulation and/or testing to both sides of the BUT simultaneously and/or sequentially. If, as is preferable, stimulation is applied simultaneously to both sides of the BUT, the stimulation is applied so as to induce potentials which, when the electromagnetic field in proximity to the BUT is sensed, it is possible to distinguish between potentials induced by stimulators adjacent to the first side of the BUT and potentials induced by stimulators adjacent to the second side of the BUT.

For example stimulators may be operated on both opposite sides of a BUT while the BUT is sensed by sensors on one or both sides thereof. Stimulation on opposite sides of a BUT may take place concurrently and/or sequentially. Stimulation on both sides of the BUT may be at different frequencies or multiplexed. The same or different sequence of stimulation may be used for testing a BUT in mutually "upside-down" orientations, and the BUT may be tested sequentially in substantially orthogonal directions.

The inventors have found that the present invention results not only in a time savings by preferably providing simultaneous performance of non-contact testing steps which previously could only have been performed sequentially, but additionally significantly increases the detectability of faults in BUTs and reduces false alarms.

One particular advantage of the present invention lies in the fact that by using sensors each of which simultaneously detects potentials induced by multiple, separable electromagnetic stimuli, the potential patterns generated are automatically spatially registered thus generally obviating the need for further spatial registration. As a result, distribution patterns of potentials received in respect of stimulation provided on the same side of the BUT as on which the potentials are sensed are easily correlated with distribution patterns of potentials received in respect of stimulation provided on the opposite side of the BUT from that on which the potentials are sensed.

Figure 12:
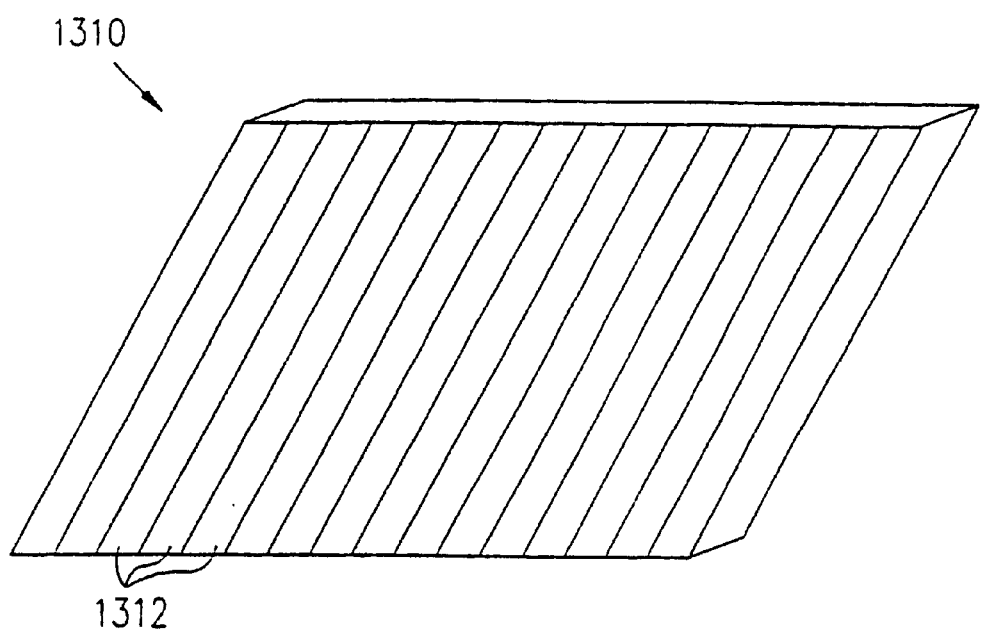
FIGS. 12 and 13 schematic illustrations of two alternative stimulator configurations.
Figure 13:
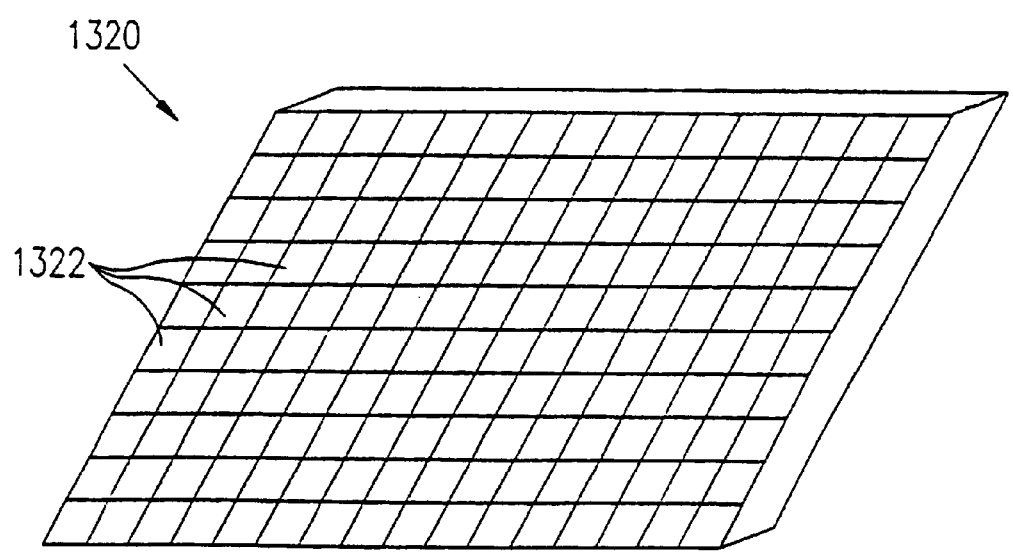

Reference is now made to FIGS. 12 and 13, which are schematic illustrations of two alternative preferred configurations of first side stimulators 14 and 16 and second side stimulator 20. The configurations illustrated in FIGS. 12 and 13 are designed to reduce interference difficulties, such as capacitance interference as may be caused by conductors which cross through metal layers such as first metal layer 54 and second metal layer 56 (FIG. 2).

Referring to FIG. 12, it is seen that a stimulator 1310 is preferably sectioned into a plurality of mutually aligned linear stimulation strips 1312, which are oriented perpendicular orientation to the scanning direction along which a BUT, such as BUT 12 shown in FIG. 2, is scanned.

Turning now to FIG. 13, a stimulator 1320 may be partitioned into a multiplicity of individual stimulator patches 1322, each patch being a separate individually controllable antenna. As is readily appreciated, strips 1312 of stimulator 1310, as shown in FIG. 12, and stimulation patches 1322 of stimulator 1320 as shown in FIG. 13 are preferably provided with AC stimulation signals of different frequencies or multiplexed inputs, in order to enable separation of potentials induced by individual strips 1312 or patches 1322 respectively.

Figure 14:
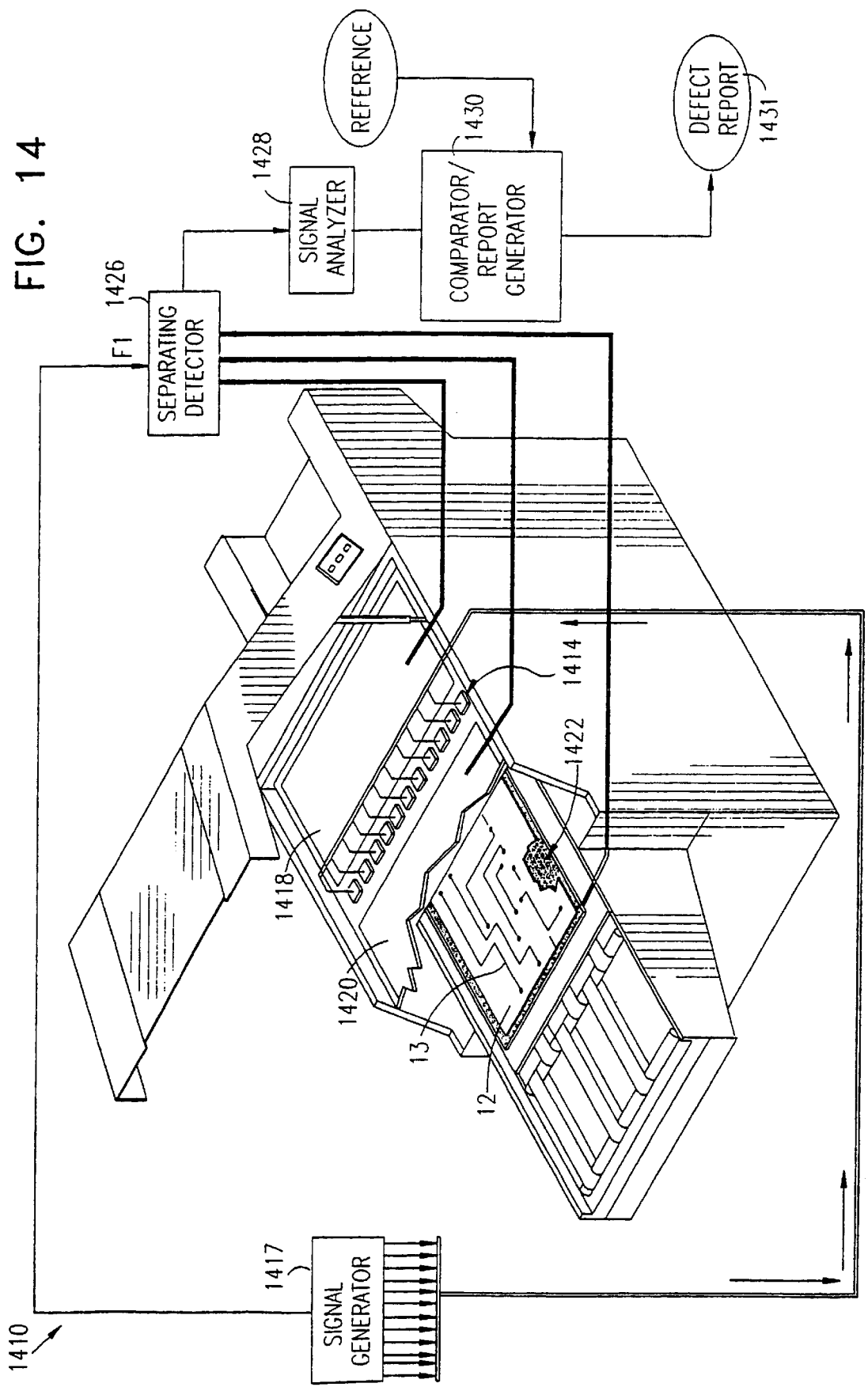
FIG. 14 is a simplified pictorial illustration of non-contact electrical testing apparatus, constructed and operative in accordance with a second preferred embodiment of the present invention.

Reference is now made to FIG. 14 which is an alternative configuration of non-contact electrical testing apparatus constructed and operative in accordance with a preferred embodiment of the present invention. The apparatus of FIG. 14 may be similar to that shown in FIG. 1 and differs therefrom in the arrangement of the stimulators and the sensors.

As seen in FIG. 14, there is provided testing apparatus 1410, which is operative to perform non-contact electrical testing of electrical circuits, such as are found on BUT 12, having a multiplicity of electrical conductors 13. Testing apparatus 1410 comprises an array of stimulator electrodes 1414, including a multiplicity of individually controlled stimulators 1416 linearly disposed adjacent to a first side of BUT 12. A signal generator 1417 supplies an electrical stimulation signal to each of the stimulators 1416. Preferably the stimulation signals are at different frequencies, or multiplexed.

First side sensor electrodes, hereinafter referred to as sensors 1418 and 1420 are arranged on opposite sides of array 1414 to lie adjacent a first side of BUT 12. A second side sensor electrode, hereinafter referred to as sensor 1422, is arranged to underlie BUT 12 on a side thereof opposite first side sensors 1419 and 1420. Each of the sensors 1418, 1420 and 1422 is preferably at least as large as a BUT.

A separating detector 1426 receives the outputs of each sensor 1418, 1420 and 1422 respectively, and supplies the outputs to a signal analyzer 1428 which outputs to a comparator and report generator 1430.

As noted hereinabove, the AC signals provided by signal generator 1417 to each stimulator 1416 in stimulator array 1414 are preferably different. This may be accomplished either by providing signals of different frequencies or alternatively by multiplexing or other known signal differentiation methods.

When energized by the AC electrical stimulation signals, stimulators 1416 generate localized electromagnetic fields which stimulate various conductors on BUT 12. It is appreciated that each stimulator induces a characteristically different measurable potential. Sensors 1418, 1420 and 1422 sense the different potentials and preferably output to the separating detector 1426, which is operative to separate out each of the potentials.

In a preferred embodiment of the present invention, BUT 12 and second side sensor 1422 are moved linearly past stimulator array 1414 and sensors 1418 and 1420. It is readily appreciated that alternatively BUT 12 and sensor 1422 may be held stationary while stimulator array 1414 and sensors 1418 and 1420 are moved. Other combinations may also be suitable to scan BUT 12 with stimulator array 1414.

As in the apparatus described with respect to FIG. 1, by employing information indicating potentials at various locations on BUT 12 sensed by sensors 1418, 1420 and 1422, signal analyzer 1428 generates a precise representation characteristic of potentials in conductors 13 on BUT 12, which indicates, inter alia, conductor continuity and which includes information regarding shorts and breaks in conductors, which constitute defects.

The representation provided by signal analyzer 1428 to comparator and report generator 1430 enables provision of a defect report 1431 indicating defective electrical continuity in conductors 13 of BUT 12.

Figure 15:
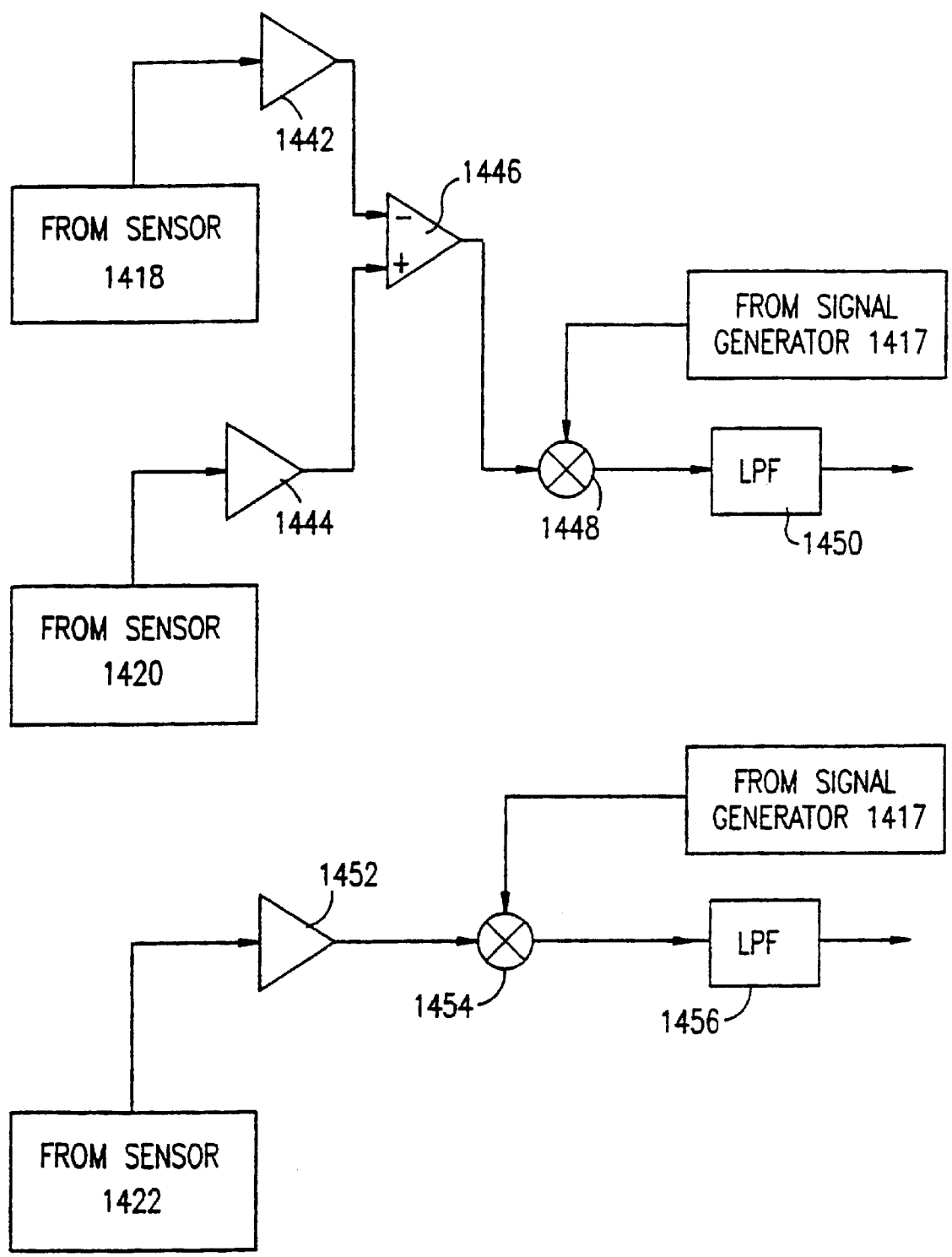
FIG. 15 is a schematic circuit diagram of an exemplary circuit useful as part of a separating detector forming part of the hardware of FIG. 14.

Turning now to FIG. 15, there is shown a schematic circuit diagram of a preferred embodiment of a separating circuitry 1440 useful in separating detector 1426 (FIG. 14). Outputs from each of top side sensors 1418 and 1420 are supplied to first and second amplifiers 1442 and 1444 respectively, which are input into a differential amplifier 1446.

The output of differential amplifier 1446 is provided to a mixer 1448 which also receives a signal input from signal generator 1417 and outputs to a low-pass filter (LPF) 1450, operative to remove undesirable AC out-band signal portions. The output of LPF 1450 is a DC voltage representative of the potential sensed on BUT 12 by a sensor 1418 or 1420 at a predetermined frequency, which is proportional to the relative amplitude of the signal input components input from sensor 1418 and 1420 respectively, each frequency being correlated to a given one of stimulators 1416, thereby to provide spatial information.

An output from bottom side sensor 1422 is supplied to an amplifier 1452 which outputs to a mixer 1454, which also receives a signal input from signal generator 1417. The output of mixer 1454 is provided to a low-pass filter (LPF) 1456, operative to remove undesirable AC out-band signal portions. The output of LPF 1456 is a DC voltage representative of the amplitude of the signal input of a potential at a predetermined frequency sensed on BUT 12 by sensor 1422.

It is readily appreciated that separate circuits may be provided for each of the frequencies at which stimulators 1416 stimulate BUT 12, or a lesser number of circuits may be employed, in which event multiplexing of signals to sensors 1416 is required.

It will be appreciated by persons skilled in the art that the present invention is not limited by what has been specifically described hereinabove. Rather the scope of the present invention includes both combinations and subcombinations of various features described hereinabove as well as modifications and variations thereof which would occur to a person skilled in the art upon reading the foregoing description and which are not in the prior art.

What is claimed is:

1. Apparatus for electrical testing of an electrical circuit having first and second side surfaces and including a plurality of conductors, the apparatus comprising:
   at least one stimulation electrode disposed adjacent at least one of said first and second side surfaces of said electrical circuit and being operative to apply thereto a stimulation electromagnetic field in a non-contact manner;
   at least one sensing electrode disposed adjacent at least one of said first and second side surfaces of said electrical circuit and being operative to sense a resulting electromagnetic field produced by application of said stimulation electromagnetic field at various locations thereon in a non-contact manner;
   a ground interconnect grounding an intermediate layer of said electrical circuit;
   wherein at least one of said at least one stimulation electrode and said at least one sensing electrode includes at least two electrodes.

2. Apparatus for electrical testing of an electrical circuit according to claim 1 and wherein said at least one simulation electrode includes at least first and second simulation electrodes disposed adjacent respective ones of said first and second side surfaces of said electrical circuit.

3. Apparatus for electrical testing of an electrical circuit according to claim 1, and wherein said at least one sensing electrode includes at least first and second sensing electrodes disposed adjacent respective ones of said first and second side surfaces of said electrical circuit.

4. Apparatus for electrical testing of an electrical circuit according to claim 1, and also comprising at least one stimulation signal generator providing at least one stimulation signal to said at least one stimulation electrode.

5. Apparatus for electrical testing of an electrical circuit according to claim 4, and wherein said at least one stimulation signal generator provides stimulation signals to a plurality of stimulation electrodes in a manner such that signals induced in said electrical circuit by individual ones of said stimulation electrodes may be distinguished from each other.

6. Apparatus for electrical testing of an electrical circuit according to claim 5, and also comprising at least one separating detector for receiving from said at least one sensing electrode signals induced in said electrical circuit by individual ones of said stimulation electrodes and distinguishing said signals from each other.

7. Apparatus for electrical testing of an electrical circuit according to claim 5, and wherein said at least one signal generator provides signals having different frequencies to different ones of said stimulation electrodes.

8. Apparatus for electrical testing of an electrical circuit according to claim 5, and wherein said at least one signal generator provides multiplexed signals to different ones of said stimulation electrodes.

9. Apparatus for electrical testing of an electrical circuit according to claim 1, and also comprising a signal analyzer operative to analyze at least one signal received from said at least one sensing electrode.

10. Apparatus for electrical testing of an electrical circuit according to claim 1, and also comprising a comparator receiving at least one signal derived from said resulting electromagnetic field and comparing said at least one signal with a reference.

11. Apparatus for electrical testing of an electrical circuit according to claim 10, and also comprising a defect report generator providing a defect report relating to said electrical circuit based on the output of said comparator.

12. Apparatus for electrical testing of an electrical circuit according to claim 1, and wherein said at least one stimulation electrode comprises first and second stimulation electrodes arranged to be disposed alongside a first side of said electrical circuit and a third stimulation electrode arranged to be disposed alongside a second side of said electrical circuit.

13. Apparatus for electrical testing of an electrical circuit according to claim 12, and wherein a linear array is disposed intermediate said first and second stimulation electrodes.

14. Apparatus for electrical testing of an electrical circuit according to claim 1, and wherein said at least one sensing electrode comprises a linear array of sensing electrodes.

15. Apparatus for electrical testing of an electrical circuit according to claim 1, and wherein said at least one stimulation electrode comprises a linear array of stimulation electrodes.

16. Apparatus for electrical testing of an electrical circuit according to claim 15, and wherein said linear array is disposed intermediate said first and second stimulation electrodes.

17. Apparatus for electrical testing of an electrical circuit according to claim 1, and wherein said at least one sensing electrode comprises first and second sensing electrodes arranged to be disposed alongside a first side of said electrical circuit and a third sensing electrode arranged to be disposed alongside a second side of said electrical circuit.

18. Apparatus for electrical testing for an electrical circuit according to claim 1, and wherein said at least one sensing electrode comprises first and second sensing electrodes arranged to be disposed alongside a first side of said electrical circuit.

19. Apparatus for electrical testing of an electrical circuit according to claim 18, and wherein a linear array is disposed intermediate first and second stimulation electrodes.

20. Apparatus for electrical testing of an electrical circuit according to claim 1, and wherein said at least one stimulation electrode comprises a plurality of individually controllable sections.

21. A method for electrical testing of an electrical circuit having first and second side surfaces and including a plurality of conductors, the method comprising:

applying an electromagnetic field in a non-contact manner to at least one of first and second side surfaces of said electrical circuit;

grounding an intermediate metal layer in said electrical circuit; and sensing a resulting electromagnetic field in a non-contact manner at various locations along at least one of said first and second side surfaces of said electrical circuit, wherein at least one of said applying and sensing employs non-contact electrodes.

22. A method for electrical testing of an electrical circuit according to claim 21, and wherein said applying step includes employing at least first and second stimulation electrodes disposed adjacent respective ones of said first and second side surfaces of said electrical circuit to apply at least one said electromagnetic field thereto.

23. A method for electrical testing of an electrical circuit according to claim 21, and wherein said sensing step includes employing at least first and second sensing electrodes disposed adjacent respective ones of said first and second side surfaces of said electrical circuit to sense said resulting electromagnetic field.

24. A method for electrical testing of an electrical circuit according claim 21, and also comprising generating at least one stimulation signal and providing it to at least one stimulation electrode.

25. A method for electrical testing of an electrical circuit according to claim 24, and wherein said generating step provides said stimulation signals to a plurality of stimulation electrodes in a manner such that signals induced in said electrical circuit by individual ones of said stimulation electrodes may be distinguished from each other.

26. A method for electrical testing of an electrical circuit according to claim 25, and also comprising receiving signals induced in said electrical circuit by individual stimulation electrodes and distinguishing said signals from each other.

27. A method for electrical testing of an electrical circuit according to claim 25, and wherein said generating step provides signals having different frequencies to different ones of said stimulation electrodes.

28. A method for electrical testing of an electrical circuit according to claim 25, and wherein said generating step provides multiplexed signals to different ones of said stimulation electrodes.

29. A method for electrical testing of an electrical circuit according to claim 21, and also comprising analyzing at least one signal induced in said electrical circuit.

30. A method for electrical testing of an electrical circuit according to claim 21, and also comprising receiving at least one signal derived from said resulting electromagnetic field and comparing said at least one signal with a reference.

31. A method for electrical testing of an electrical circuit according to claim 30, and also comprising providing a defect report relating to said electrical circuit based on the comparing step.

32. A method for electrical testing of an electrical circuit according to claim 21, and wherein said applying step employs first and second stimulation electrodes disposed alongside a first side of said electrical circuit and a third stimulation electrode disposed alongside a second side of said electrical circuit.

33. A method for electrical testing of an electrical circuit according to claim 32, and wherein a linear array is disposed intermediate first and second stimulation electrodes.

34. A method for electrical testing of an electrical circuit according to claim 32, and wherein a linear array is disposed intermediate first and second stimulation electrodes.

35. A method for electrical testing of an electrical circuit according to claim 21, and wherein said sensing step employs a linear array of sensing electrodes.

36. A method for electrical testing of an electrical circuit according to claim 21, and wherein said applying step employs a linear array of stimulation electrodes.

37. A method for electrical testing of an electrical circuit according to claim 36, and wherein said linear array is disposed intermediate first and second stimulation electrodes.

38. A method for electrical testing of an electrical circuit according to claim 21, and wherein said sensing step employs first and second sensing electrodes disposed alongside a first side of said electrical circuit and a third sensing electrode disposed alongside a second side of said electrical circuit.

39. A method for electrical testing of an electrical circuit according to claim 21, and wherein said sensing step employs first and second sensing electrodes disposed alongside a first side of said electrical circuit.

40. A method for electrical testing of an electrical circuit according to claim 21, and wherein said applying step employs a least one stimulation electrode comprising a plurality of individually controllable sections.

41. A method according to claim 21, wherein said sensing step comprises sensing potentials on one side of the electrical circuit and sensing potentials on the opposite side of the electrical circuit.

* * * * *